(12) United States Patent
Kim et al.

(10) Patent No.: US 12,211,777 B2
(45) Date of Patent: Jan. 28, 2025

(54) SEMICONDUCTOR PACKAGE INCLUDING A DUMMY PATTERN

(71) Applicant: SAMSUNG ELECTRONICS CO., LTD., Suwon-si (KR)

(72) Inventors: Minjung Kim, Cheonan-si (KR); Dongkyu Kim, Anyang-si (KR); Jongyoun Kim, Seoul (KR); Hyeonjeong Hwang, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 455 days.

(21) Appl. No.: 17/731,416

(22) Filed: Apr. 28, 2022

(65) Prior Publication Data

US 2023/0019311 A1 Jan. 19, 2023

(30) Foreign Application Priority Data

Jul. 16, 2021 (KR) ........................ 10-2021-0093246

(51) Int. Cl.
*H01L 23/498* (2006.01)
*H01L 23/00* (2006.01)
*H01L 25/10* (2006.01)

(52) U.S. Cl.
CPC .. *H01L 23/49816* (2013.01); *H01L 23/49822* (2013.01); *H01L 23/49838* (2013.01); *H01L 25/105* (2013.01); *H01L 23/49833* (2013.01); *H01L 24/16* (2013.01); *H01L 24/32* (2013.01); *H01L 24/48* (2013.01); *H01L 24/73* (2013.01); *H01L 2224/16227* (2013.01); *H01L 2224/16238* (2013.01); *H01L 2224/32225* (2013.01); *H01L 2224/48221* (2013.01); *H01L 2224/73204* (2013.01); *H01L 2224/73265* (2013.01); *H01L 2225/1035* (2013.01); *H01L 2225/1041* (2013.01); *H01L 2225/1058* (2013.01)

(58) Field of Classification Search
CPC ......... H01L 23/49816; H01L 23/49822; H01L 23/49838
See application file for complete search history.

(56) References Cited

U.S. PATENT DOCUMENTS

| | | | |
|---|---|---|---|
| 7,812,456 | B2 | 10/2010 | Koide et al. |
| 7,989,959 | B1 | 8/2011 | Rahman |
| 2009/0084585 | A1 | 4/2009 | Matsumoto |
| 2011/0232943 | A1 | 9/2011 | Hida et al. |
| 2014/0182916 | A1 | 7/2014 | Shin et al. |

(Continued)

FOREIGN PATENT DOCUMENTS

| | | |
|---|---|---|
| JP | 6699131 | 5/2020 |
| JP | 2020-136314 | 8/2020 |
| KR | 10-1995-0021146 | 7/1995 |

*Primary Examiner* — Erik Kielin
(74) *Attorney, Agent, or Firm* — F. CHAU & ASSOCIATES, LLC

(57) ABSTRACT

A semiconductor package including: a first substrate and a semiconductor device on the first substrate, wherein the first substrate includes: a first dielectric layer including a first hole; a second dielectric layer on the first dielectric layer and including a second hole that overlaps the first hole, the second hole being wider than the first hole; an under bump disposed in the first hole and the second hole, the under bump covering a portion of the second dielectric layer; and a connection member bonded to the under bump.

20 Claims, 21 Drawing Sheets

(56) References Cited

U.S. PATENT DOCUMENTS

| | | |
|---|---|---|
| 2018/0047661 A1 | 2/2018 | Oshima et al. |
| 2018/0310413 A1 | 10/2018 | Kasai et al. |
| 2019/0103353 A1 | 4/2019 | Liu et al. |
| 2020/0185314 A1* | 6/2020 | Kim .................. H01L 23/49822 |
| 2021/0183756 A1* | 6/2021 | Chae ................. H01L 23/49822 |
| 2021/0375810 A1* | 12/2021 | Kim .................... H01L 23/5384 |

* cited by examiner

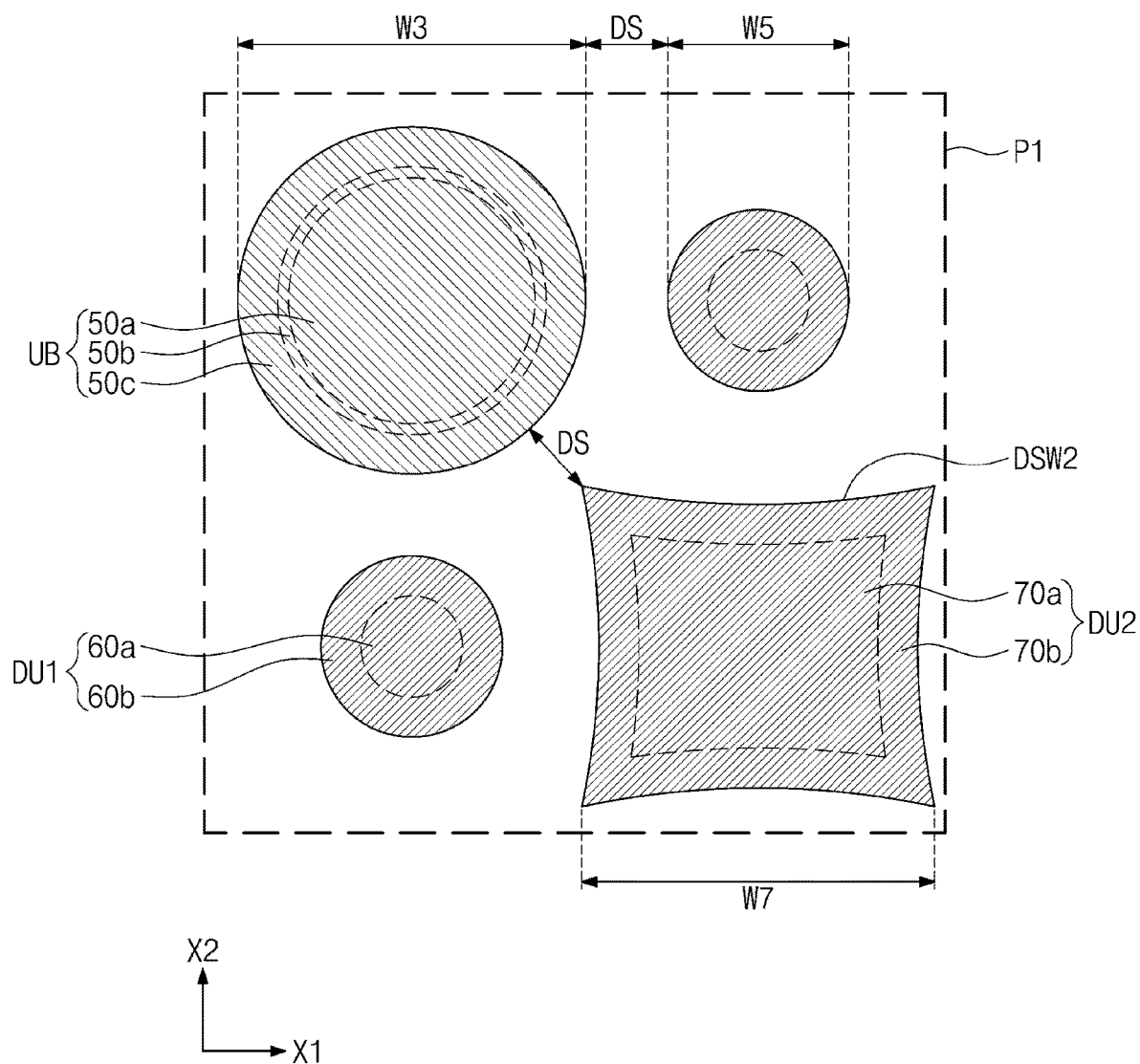

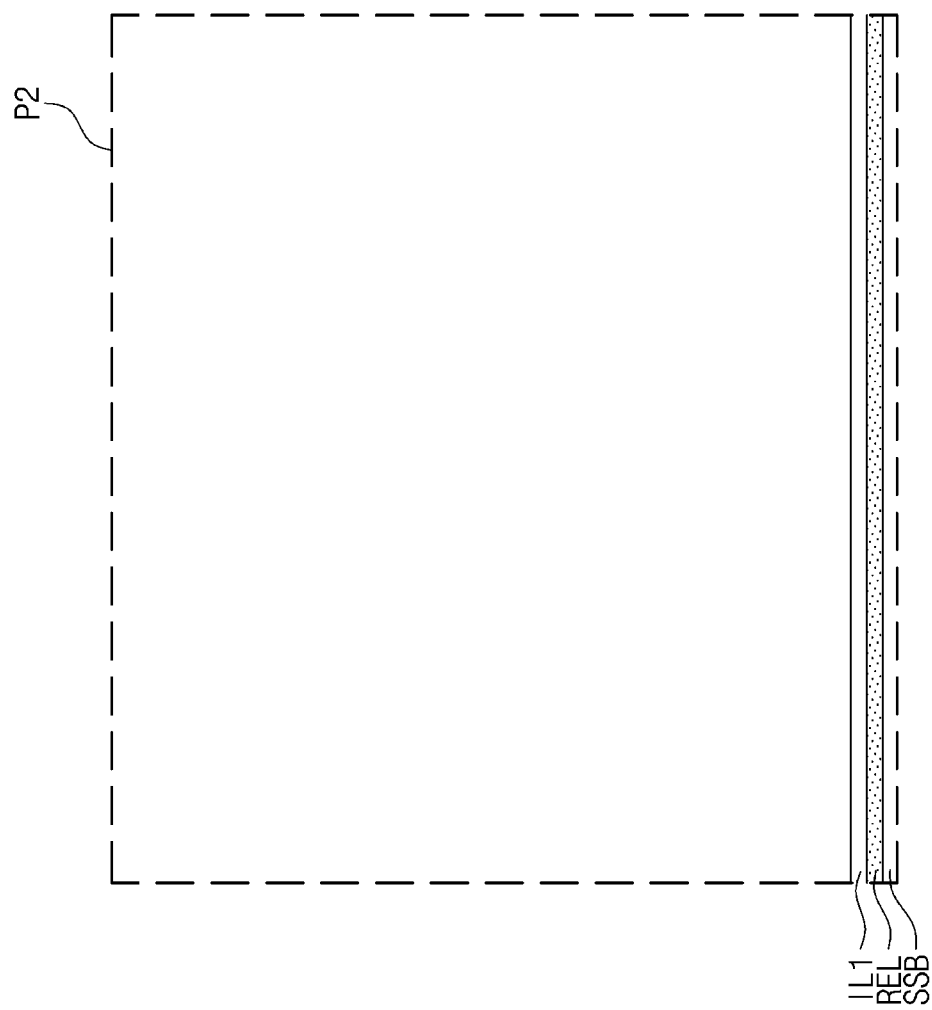

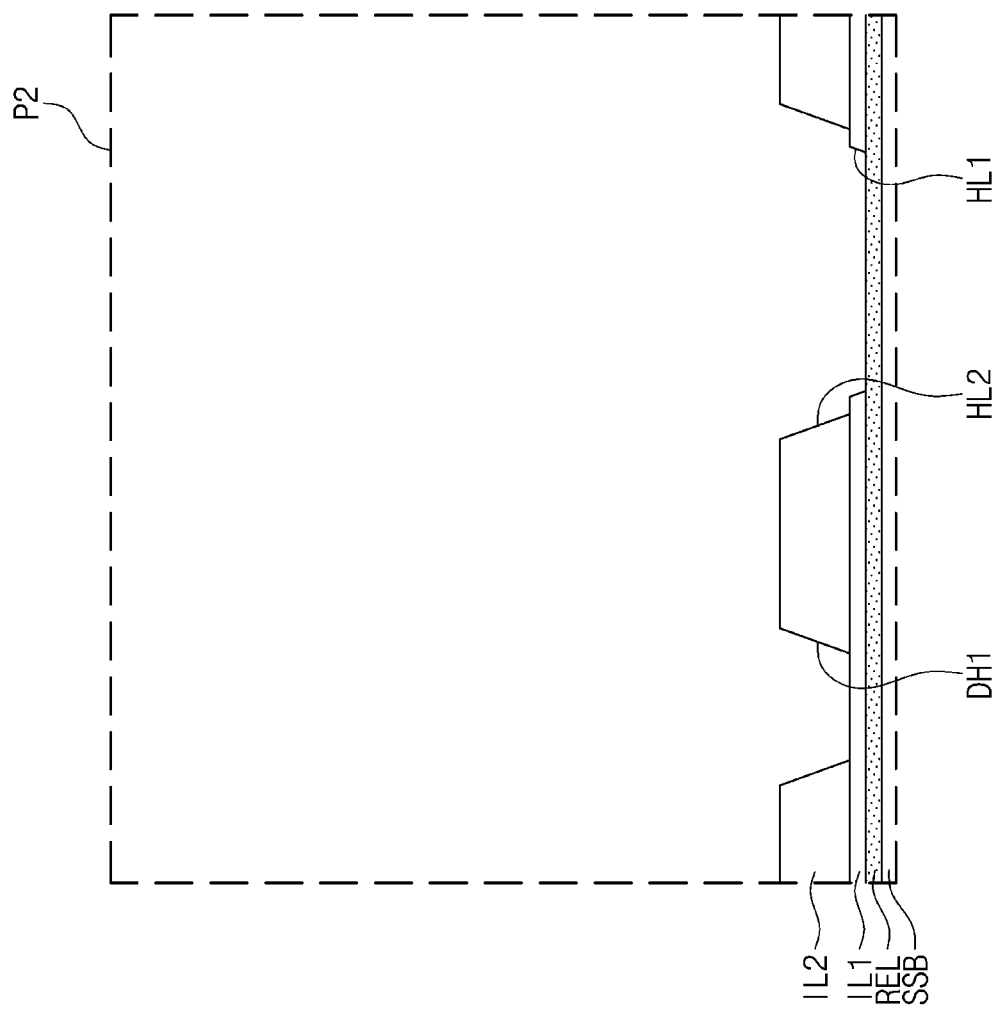

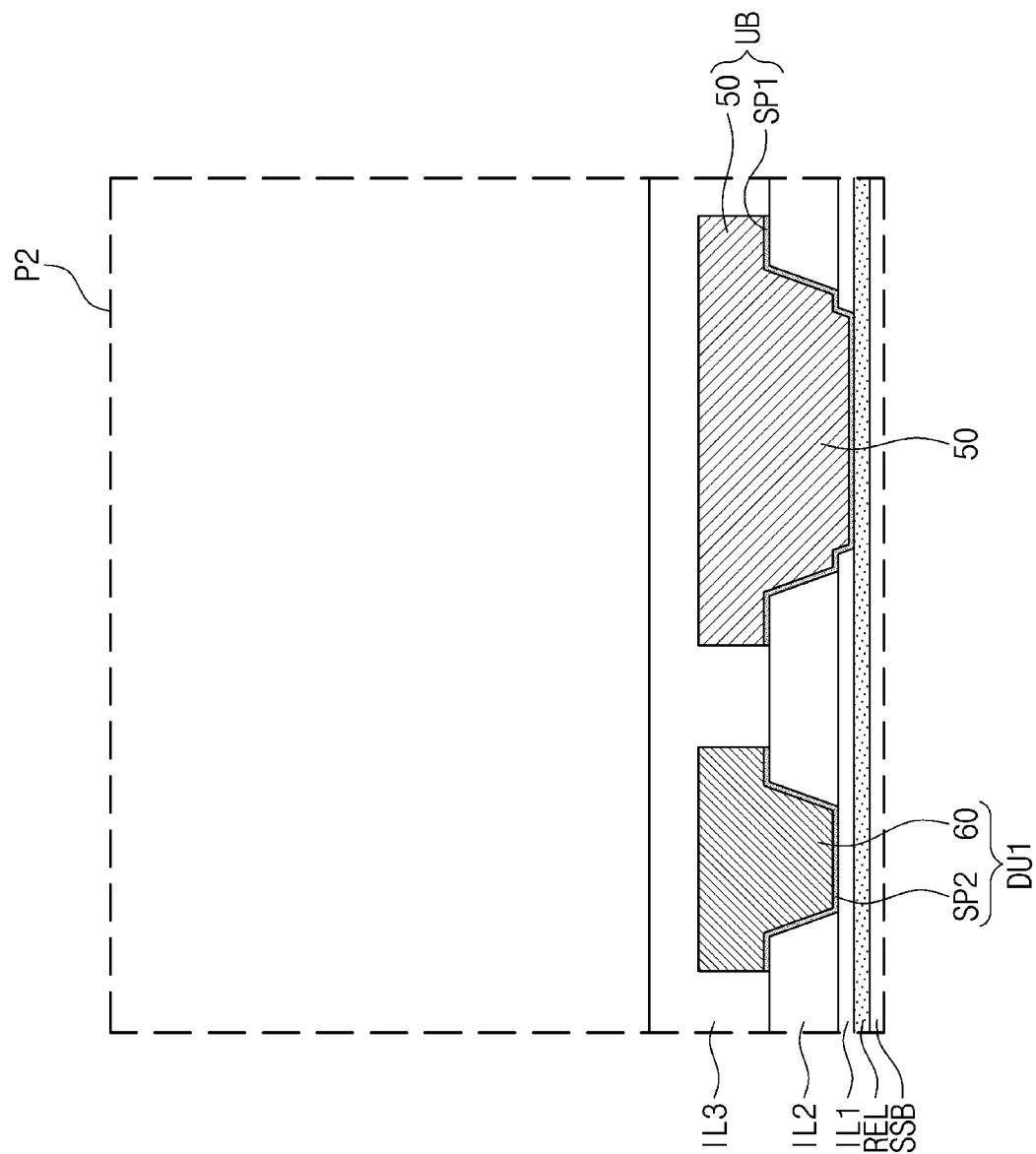

SEMICONDUCTOR PACKAGE INCLUDING A DUMMY PATTERN

CROSS-REFERENCE TO RELATED APPLICATION

This U.S. nonprovisional application claims priority under 35 U.S.C. § 119 to Korean Patent Application No. 10-2021-0093246 filed on Jul. 16, 2021 in the Korean Intellectual Property Office, the disclosure of which is incorporated by reference herein in its entirety.

TECHNICAL FIELD

The present inventive concept relates to a semiconductor package, and more particularly, to a semiconductor package including a dummy pattern.

DISCUSSION OF RELATED ART

A semiconductor package is a casing containing one or discrete semiconductor device or integrated circuits. A semiconductor package is typically configured such that a semiconductor chip may be mounted on a printed circuit board (PCB) and bonding wires or bumps may be used to electrically connect the semiconductor chip to the printed circuit board. The PCB is used to connect the semiconductor package to the external environment via leads such as lands, balls or pins. As the electronics industry continues to develop, many studies have been conducted to increase reliability and durability of semiconductor packages.

SUMMARY

Example embodiments of the present inventive concept provide a semiconductor package with increased reliability.

According to an example embodiment of the present inventive concept, a semiconductor package includes: a first substrate and a semiconductor device on the first substrate, wherein the first substrate includes: a first dielectric layer including a first hole; a second dielectric layer on the first dielectric layer and including a second hole that overlaps the first hole, the second hole being wider than the first hole; an under bump disposed in the first hole and the second hole, the under bump covering a portion of the second dielectric layer; and a connection member bonded to the under bump.

According to an example embodiment of the present inventive concept, a semiconductor package includes: a package substrate; an interposer substrate on the package substrate; a first semiconductor device and a second semiconductor device mounted side by side on the interposer substrate; and a thermal radiation member that covers the first semiconductor device, the second semiconductor device, the interposer substrate, and the package substrate, wherein the interposer substrate includes: a first dielectric layer including a first hole; a second dielectric layer disposed on the first dielectric layer and including a second hole that overlaps the first hole, the second hole being wider than the first hole; an under bump disposed in the first hole and the second hole, the under bump covering a portion of the second dielectric layer; a connection member bonded to the under bump; and a dummy pattern spaced apart from the under bump, the dummy pattern penetrating the second dielectric layer and contacting the first dielectric layer, wherein a portion of the dummy pattern covers a top surface of the second dielectric layer, wherein a bottom surface of the dummy pattern is coplanar with a bottom surface of the second dielectric layer, and wherein an interval between the under bump and the dummy pattern is about 5 µm to about 50 µm.

According to an example embodiment of the present inventive concept, a semiconductor package includes: a first substrate and a semiconductor device on the first substrate, wherein the first substrate includes: a first dielectric layer; an under bump and a dummy pattern that are in the first dielectric layer and are spaced apart from each other; and a connection member in contact with a bottom surface of the under bump, wherein each of the under bump and the dummy pattern includes: a first part inserted into the first dielectric layer; and a second part that protrudes beyond the first dielectric layer and covers a top surface of the first dielectric layer, wherein a sidewall of the first part of the under bump has an inflection point, and wherein a bottom surface of the dummy pattern is covered with a portion of the first dielectric layer.

According to an example embodiment of the present inventive concept, a semiconductor package includes: a first substrate and a semiconductor device on the first substrate, wherein the first substrate includes: a first dielectric layer; and an under bump and a dummy pattern that are in the first dielectric layer and are spaced apart from each other, wherein each of the under bump and the dummy pattern includes: a first part inserted into the first dielectric layer; and a second part that protrudes beyond the first dielectric layer and covers a top surface of the first dielectric layer, wherein the under bump has a first thickness, and wherein the dummy pattern has a second thickness less than the first thickness.

According to an example embodiment of the present inventive concept, a semiconductor package includes: a first substrate and a semiconductor device on the first substrate, wherein the first substrate includes: a first dielectric layer that includes a first hole; an under bump that includes a first part and a second part, the first part disposed in the first hole, and the second part covering a top surface of the first dielectric layer; and a connection member bonded to the under bump, wherein the under bump includes: a barrier/seed pattern that covers an inner sidewall of the first hole; and a bump metal pattern disposed on the barrier/seed pattern and filling the first hole, wherein the connection member is in contact with the bump metal pattern and is spaced apart from the barrier/seed pattern.

According to an example embodiment of the present inventive concept, a semiconductor package includes: a first substrate and a semiconductor device on the first substrate, wherein the first substrate includes: a first dielectric layer; first, second, and third under bumps that are in the first dielectric layer and are spaced apart from each other, the first, second and third under bumps having the same shape; a first dummy pattern between the first under bump and the second under bump; and a second dummy pattern between the second under bump and the third under bump, wherein, when viewed in plan, a shape of the first dummy pattern is different from a shape of the second dummy pattern.

BRIEF DESCRIPTION OF THE DRAWINGS

FIG. 3A illustrates an enlarged view showing section P1 of FIG. 1.

FIGS. 5A, 5B, 5C, 5D, 5E, 5F, 5G, 5H and 5I illustrate enlarged cross-sectional views showing a method of fabricating a semiconductor package having the enlarged cross-section of FIG. 3C according to some example embodiments of the present inventive concept.

DETAILED DESCRIPTION OF THE EMBODIMENTS

Some example embodiments of the present inventive concept will now be described in detail with reference to the accompanying drawings. In this description, such terms as "first" and "second" may be used to distinguish identical or similar components from each other, and the sequence of such terms may be changed in accordance with the order of mention.

Figure 1:
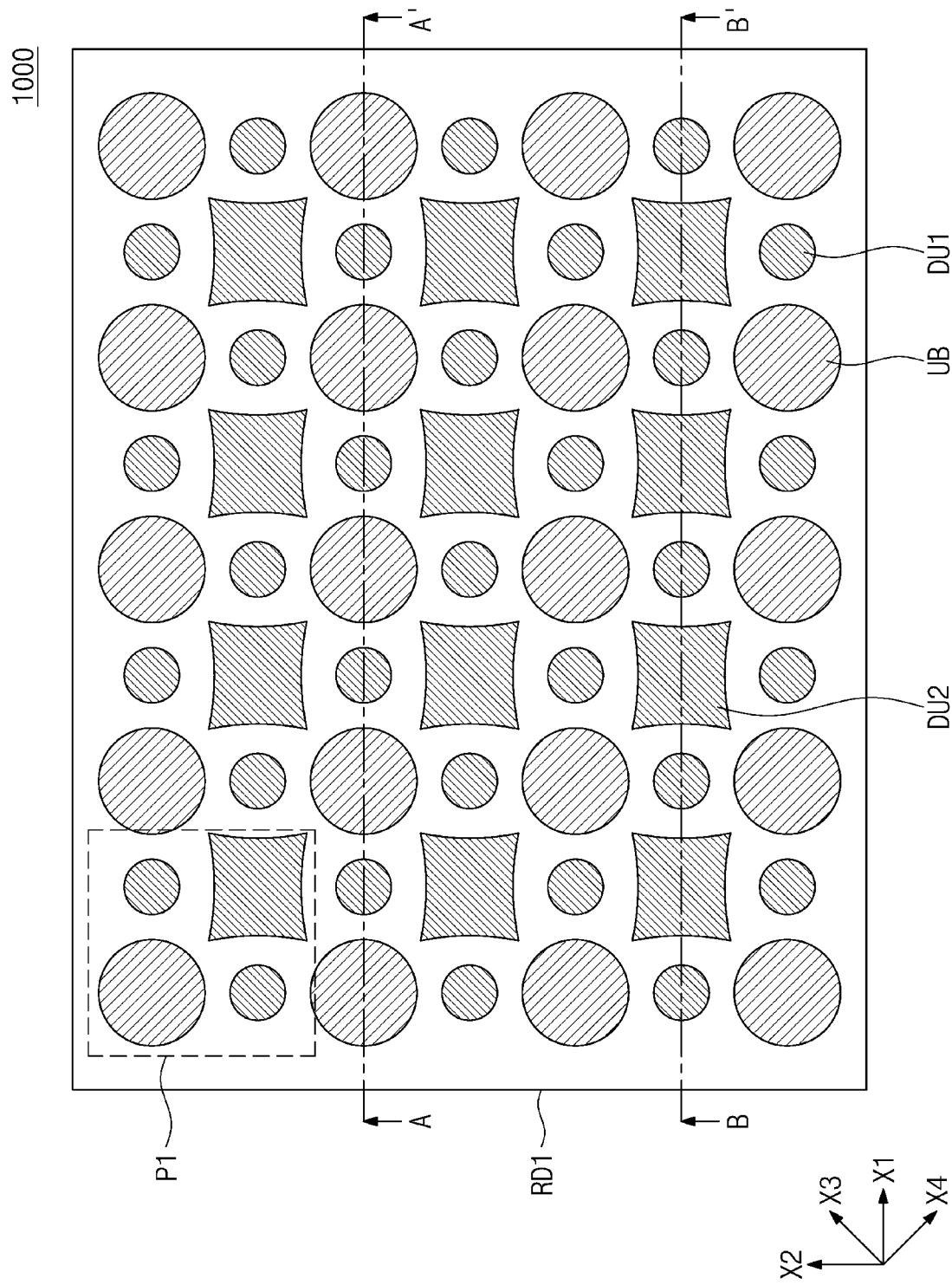
FIG. 1 illustrates a plan view showing a semiconductor package according to some example embodiments of the present inventive concept.
Figure 2A:
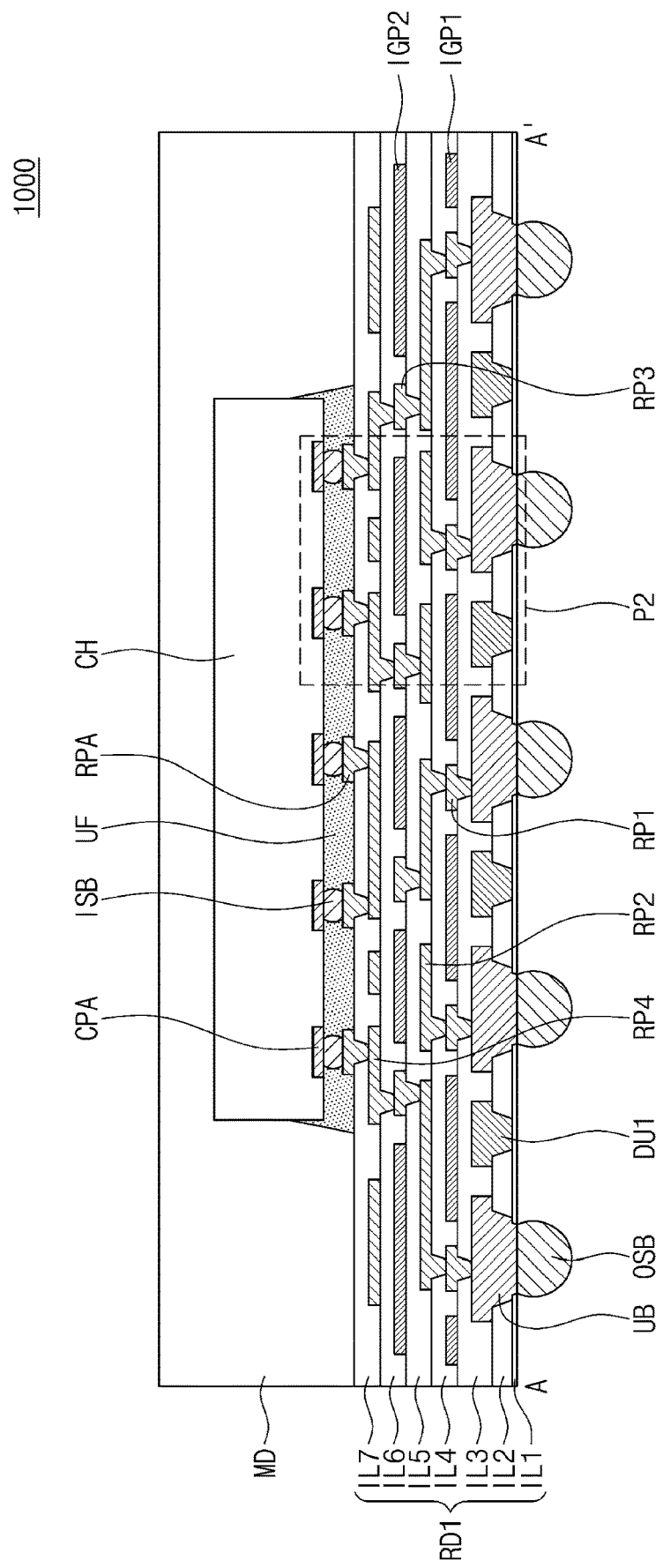
FIG. 2A illustrates a cross-sectional view taken along line A-A' of FIG. 1.
Figure 2B:
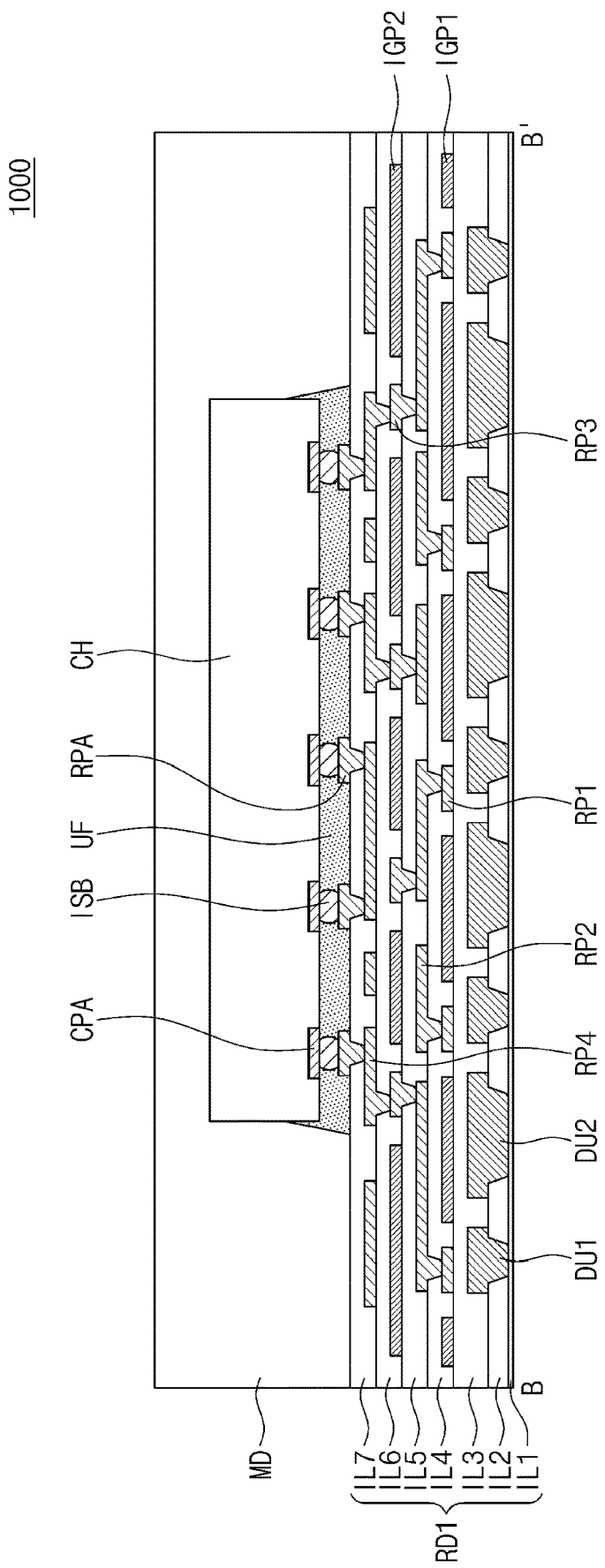
FIG. 2B illustrates a cross-sectional view taken along line B-B' of FIG. 1.
Figure 3B:
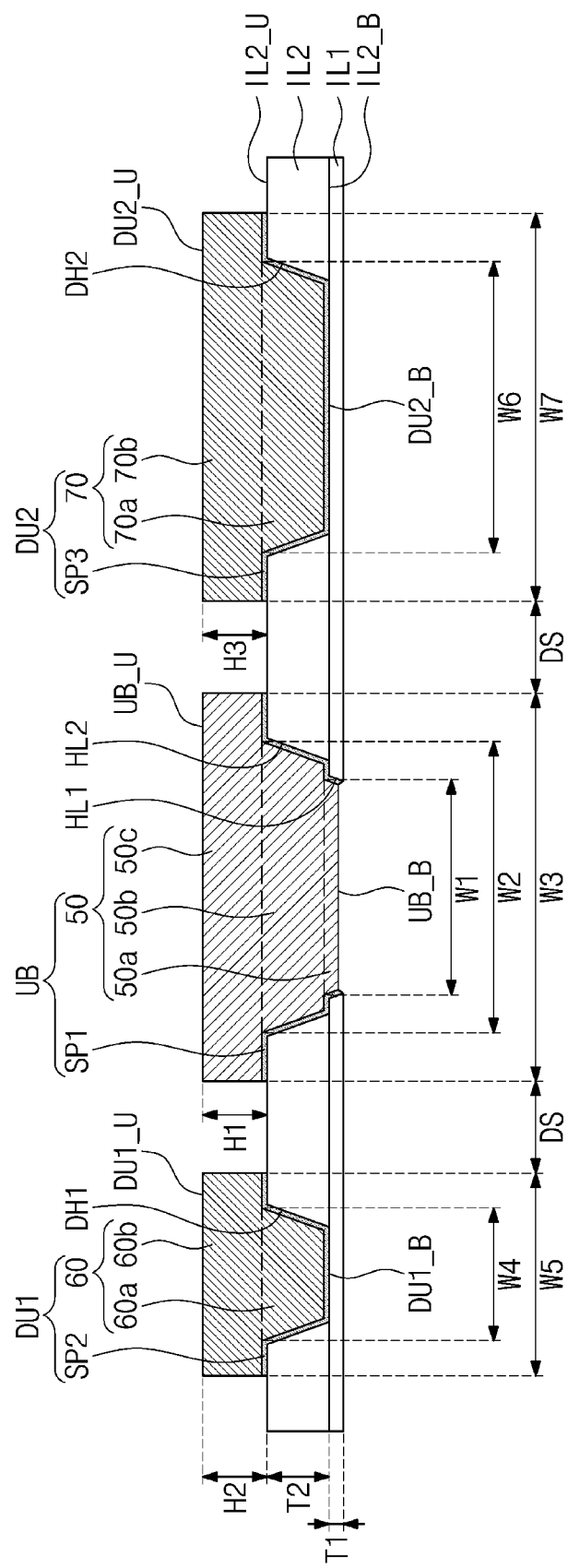
FIG. 3B illustrates a cross-sectional view showing an under bump and dummy patterns according to some example embodiments of the present inventive concept.
Figure 3C:
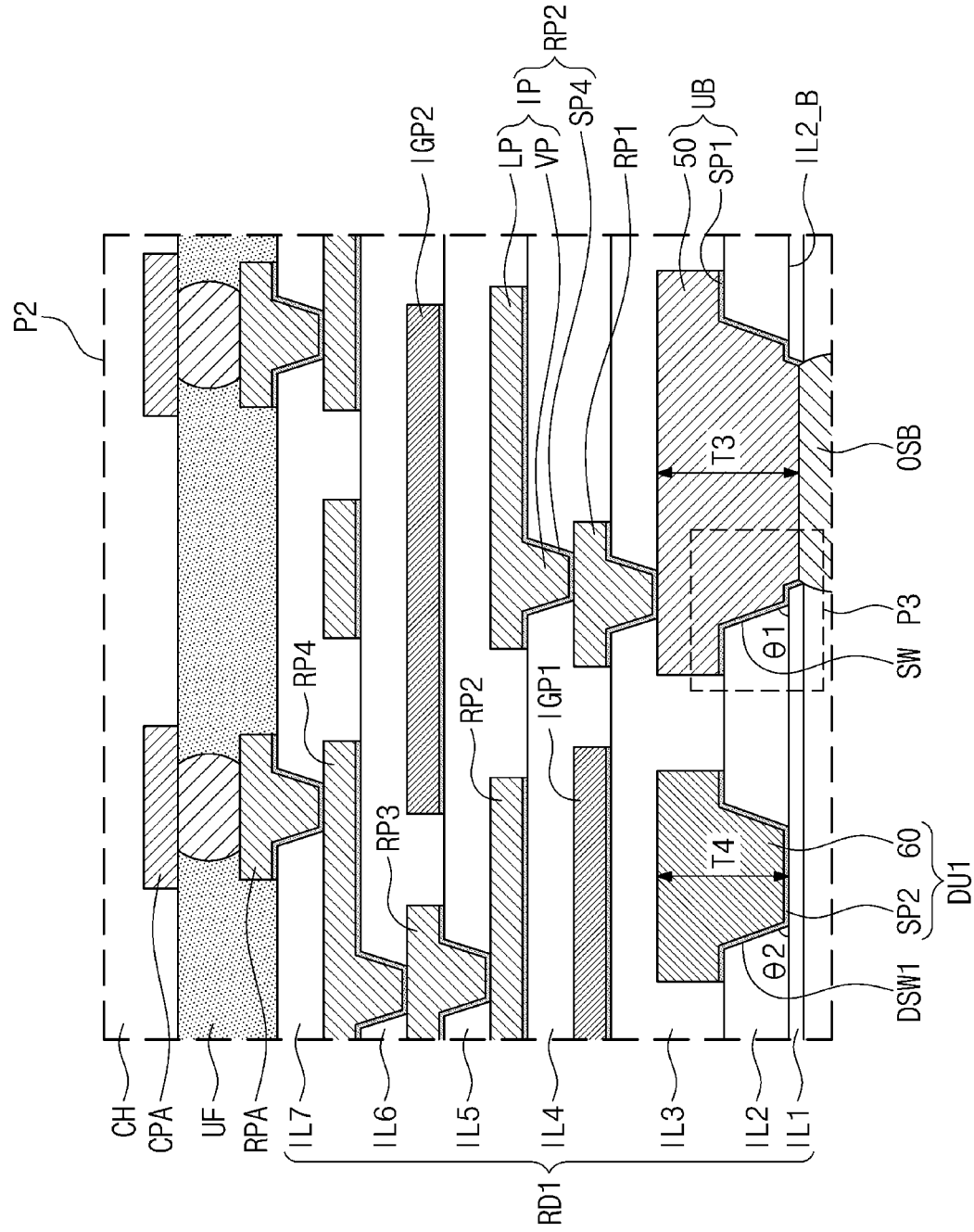
FIG. 3C illustrates an enlarged view showing section P2 of FIG. 2A.
Figure 4A:
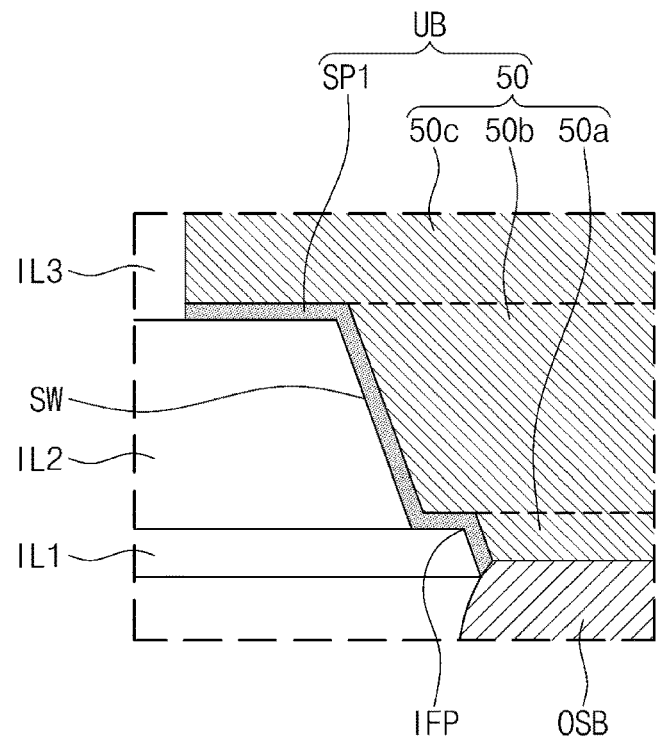
FIGS. 4A and 4B illustrate enlarged views showing section P3 of FIG. 3C.
Figure 4B:
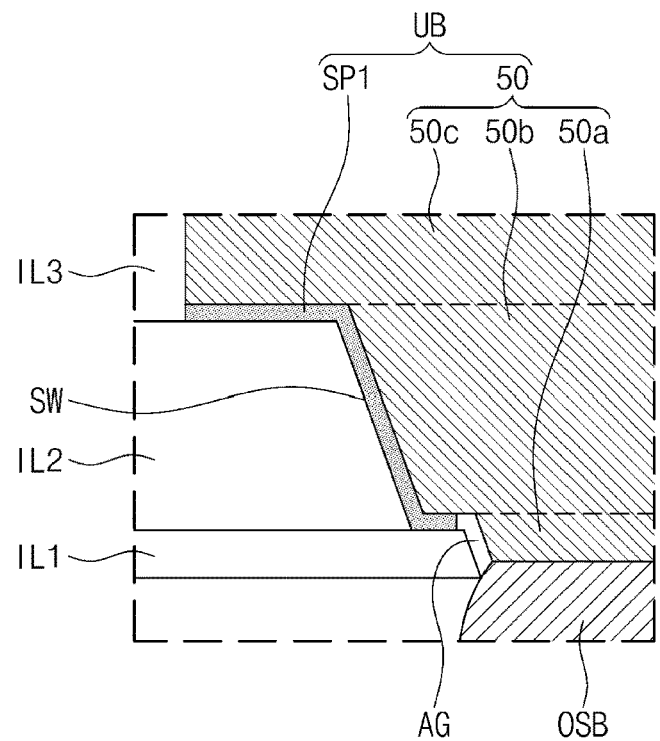

FIG. 1 illustrates a plan view showing a semiconductor package according to some example embodiments of the present inventive concept. FIG. 2A illustrates a cross-sectional view taken along line A-A' of FIG. 1. FIG. 2B illustrates a cross-sectional view taken along line B-B' of FIG. 1. FIG. 3A illustrates an enlarged view showing section P1 of FIG. 1. FIG. 3B illustrates a cross-sectional view showing an under bump and dummy patterns according to some example embodiments of the present inventive concept. FIG. 3C illustrates an enlarged view showing section P2 of FIG. 2A. FIGS. 4A and 4B illustrate enlarged views showing section P3 of FIG. 3C.

FIGS. 1, 2A, 2B, and 3A to 3C, a semiconductor package 1000 according to the present embodiment may be configured such that a semiconductor device CH may be mounted on a first redistribution substrate RD1. The semiconductor device CH and the first redistribution substrate RD1 may be covered with a mold layer MD.

The first redistribution substrate RD1 may include first, second, third, fourth, fifth, sixth and seventh dielectric layers IL1, IL2, IL3, IL4, IL5, IL6 and IL7 that are sequentially stacked. The first redistribution substrate RD1 may further include an under bump UB, dummy patterns DU1 and DU2, first, second, third and fourth redistribution patterns RP1, RP2, RP3 and RP4, and a redistribution conductive pad RPA. The first to seventh dielectric layers IL1 to IL7 may each include, for example, a photo-imageable dielectric (PID). The under bump UB, the dummy patterns DU1 and DU2, the first to fourth redistribution patterns RP1 to RP4, and the redistribution conductive pad RPA may each include a conductive material.

For example, the first dielectric layer IL1 may be thinner than any other of the first to seventh dielectric layers IL1 to IL7. As shown in FIG. 3B, the first dielectric layer IL1 may have a first thickness T1. The second dielectric layer IL2 may have a second thickness T2 greater than the first thickness T1. The first thickness T1 may be about ½ to about 1/20 of the second thickness T2. The thicknesses of each of the third to seventh dielectric layers IL3 to IL7 may be about ⅔ to about ⅗ of the second thickness T2. The first dielectric layer IL1 may be located at the bottom of the semiconductor package 1000.

The first redistribution substrate RD1 may include a plurality of under bumps UB that are two-dimensionally arranged along a first direction X1 and a second direction X2. The under bumps UB may be provided on the redistribution substrate RD1 with external connection members OSB bonded thereto. The external connection members OSB may be, for example, solder balls, conductive bumps, or conductive pillars. The external connection members OSB may include, for example, one or more of tin, nickel, silver, copper, gold, and aluminum. The dummy patterns DU1 and DU2 may be disposed between the under bumps UB. A range of about 5 μm to about 50 μm may be an interval DS between the under bump UB and one of the dummy patterns DU1 and DU2. The under bumps UB may be exposed between the first dielectric layer IL1 for connecting with the external connection members OSB.

As shown in FIG. 3A, when viewed in plan, the under bump UB may have a circular shape with a third width W3. As illustrated in FIG. 3B, the first dielectric layer IL1 may include a first hole HL1 with a first width W1. The second dielectric layer IL2 may have a second hole HL2 that overlaps the first hole HL1 and has a second width W2 greater than the first width W1. The under bump UB may be inserted into the first hole HL1 and the second hole HL2. The under bump UB may be exposed to the outside via the first hole HL1.

The under bump UB may include a bump metal pattern 50 and a first barrier/seed pattern SP1. The first barrier/seed pattern SP1 may cover a portion of a top surface IL2_U of the second dielectric layer IL2, an inner sidewall of the second hole HL2, a portion of the first dielectric layer IL1, and an inner sidewall of the first hole HL1.

The bump metal pattern 50 may include a first bump part 50a inserted into the first hole HL1, a second bump part 50b inserted into the second hole HL2, and a third bump part 50c that protrudes outwardly beyond the top surface IL2_U of the second dielectric layer IL2. The third bump part 50c may also be disposed on the top surface IL2_U of the second dielectric layer IL2. The first bump part 50a may have a bottom surface UB_B that is not covered with the first barrier/seed pattern SP1 and is in contact with the external connection member OSB. The first to third bump parts 50a to 50c may be integrally formed into a single unitary piece. The first to third bump parts 50a to 50c may each have a circular shape when viewed in plan.

The first bump part 50a may have the first width W1. The second bump part 50b may have the second width W2 greater than the first width W1. The third bump part 50c may have the third width W3 greater than the second width W2. The under bump UB may have a T-shaped cross-section. A portion of the third bump part 50c may cover the top surface IL2_U of the second dielectric layer IL2. The second bump part 50b may downwardly protrude from a lower portion of the third bump part 50c. The second bump part 50b may fill the second hole HL2. The second bump part 50b may cover a portion of the top surface of the first dielectric layer IL1. The first bump part 50a may downwardly protrude from a lower portion of the second bump part 50b. The first bump part 50a may fill the first hole HL1.

Referring to FIG. 4A, the under bump UB may have a sidewall SW that has an inflection point IFP adjacent to the top surface of the first dielectric layer IL1. There are indistinct boundaries between the first to seventh dielectric layers IL1 to IL7. For example, the first dielectric layer IL1 and the second dielectric layer IL2 may have a vague boundary therebetween, and may be considered as a single dielectric. In this case, the first hole HL1 and the second hole HL2 may be merged together to form one bump hole. The inflection point IFP on the sidewall SW of the under bump UB may be considered as an inflection point on an inner sidewall of the bump hole.

The first barrier/seed pattern SP1 of the under bump UB may have a bottom end in contact with the external connection member OSB. Alternatively, as shown in FIG. 4B, the first barrier/seed pattern SP1 of the under bump UB may have a bottom end that is not in contact with the external connection member OSB. Here, the first barrier/seed pattern SP1 of the under bump UB is spaced apart from the external connection member OSB. Therefore, an air gap AG may be formed between the first dielectric layer IL1 and the under bump UB. The air gap AG may be positioned between the first barrier/seed pattern SP1 and the external connection member OSB.

As illustrated in FIG. 3A, the dummy patterns DU1 and DU2 may include first dummy patterns DU1 and second dummy patterns DU2 whose shape is different from that of the first dummy patterns DU1. The first dummy patterns DU1 may be disposed in the first and second directions X1 and X2 between the under bumps UB. The under bumps UB may be provided between the second dummy patterns DU2 that are disposed in one of third and fourth directions X3 and X4. Each of the third and fourth directions X3 and X4 is a diagonal direction that intersects both of the first and second directions X1 and X2.

In the present embodiment, when viewed in plan, the first dummy patterns DU1 may each have a circular shape with a fifth width W5. When viewed in plan, the second dummy patterns DU2 may each have a tetragonal shape with concave sidewalls DSW2. The second dummy patterns DU2 may each have a seventh width W7 when viewed in plan.

The planar shapes of the first and second dummy patterns DU1 and UD2 may be variously changed without being limited to that discussed above. For example, the first and second dummy patterns DU1 and DU2 may independently have a circular shape, an oval shape, a triangular shape, a tetragonal shape, a pentagonal shape, or any other shape. For another example, the first and second dummy patterns DU1 and DU2 may have the same shape and may have the same or different sizes.

Referring to FIG. 3B, the second dielectric layer IL2 may include a first dummy hole DH1 and a second dummy hole DH2 that expose the top surface of the first dielectric layer IL1. The first dummy pattern DU1 may be disposed in the first dummy hole DH1 and may be in contact with the top surface of the first dielectric layer IL1. The second dummy pattern DU2 may be disposed in the second dummy hole DH2 and may be in contact with the top surface of the first dielectric layer IL1. The first and second dummy patterns DU1 and DU2 may have respective bottom surfaces DU1_B and DU2_B coplanar with a bottom surface IL2_B of the second dielectric layer IL2. The first and second dummy patterns DU1 and DU2 may each have a T-shaped cross-section.

The first dummy pattern DU1 may include a first dummy metal pattern 60 and a second barrier/seed pattern SP2. The second barrier/seed pattern SP2 may cover a portion of the top surface IL2_U of the second dielectric layer IL2 and may also cover an inner sidewall and a bottom surface of the first dummy hole DH1. The first dummy metal pattern 60 may include a first dummy part 60a inserted into the first dummy hole DH1 and a second dummy part 60b that outwardly protrudes beyond the top surface IL2_U of the second dielectric layer IL2. For example, the second dummy part 60b may overlap the top surface IL2_U of the second dielectric layer IL2. The first dummy part 60a may have a bottom surface that is covered with the second barrier/seed pattern SP2. The second barrier/seed pattern SP2 may have a bottom surface that is covered with the first dielectric layer IL1. The first dummy part 60a and the second dummy part 60b may be integrally formed into a single unitary piece. The first dummy part 60a and the second dummy part 60b may each have a circular shape when viewed in plan. The first dummy part 60a may have a fourth width W4. The second dummy part 60b may have the fifth width W5 greater than the fourth width W4. A portion of the second dummy part 60b may cover the top surface IL2_U of the second dielectric layer IL2. The first dummy part 60a may downwardly protrude from a lower portion of the second dummy part 60b. In this case, the first dummy part 60a may fill the first dummy hole DH1.

The second dummy pattern DU2 may include a second dummy metal pattern 70 and a third barrier/seed pattern SP3. The third barrier/seed pattern SP3 may cover a portion of the top surface IL2_U of the second dielectric layer IL2 and may also cover an inner sidewall and a bottom surface of the second dummy hole DH2. The second dummy metal pattern 70 may include a third dummy part 70a inserted into the second dummy hole DH2 and a fourth dummy part 70b that outwardly protrudes beyond the top surface IL2_U of the second dielectric layer IL2. For example, the fourth dummy part 70b may overlap the top surface IL2_U of the second dielectric layer IL2. The third dummy part 70a may have a bottom surface that is covered with the third barrier/seed pattern SP3. The third barrier/seed pattern SP3 may have a bottom surface that is covered with the first dielectric layer IL1. The third dummy part 70a and the fourth dummy part 70b may be integrally formed into a single unitary piece. The third dummy part 70a and the fourth dummy part 70b may each have a tetragonal shape with concave sidewalls when viewed in plan.

The third dummy part 70a may have a sixth width W6. The fourth dummy part 70b may have the seventh width W7 greater than the sixth width W6. A portion of the fourth dummy part 70b may cover the top surface IL2_U of the second dielectric layer IL2. The third dummy part 70a may downwardly protrude from a lower portion of the fourth dummy part 70b. In this case, the third dummy part 70a may fill the second dummy hole DH2.

In the present embodiment, the third width W3 may range, for example, from about 100 μm to about 300 μm. The fifth width W5 may be less than the third width W3. The seventh width W7 may be greater than the fifth width W5. The seventh width W7 may be equal to or greater than the third width W3.

The under bump UB may have a top surface UB_U located at a first height H1 from the top surface IL2_U of the second dielectric layer IL2. The first dummy pattern DU1 may have a top surface DU1_U located at a second height H2 from the top surface IL2_U of the second dielectric layer IL2. The second dummy pattern DU2 may have a top surface DU2_U located at a third height H3 from the top surface IL2_U of the second dielectric layer IL2. The first to third heights H1 to H3 may be equal to each other. The first to third heights H1 to H3 may each range from about 5 μm to about 20 μm. Alternatively, when the third width W3 and the seventh width W7 are equal to each other and greater than the fifth width W5 (W3=W7>W5), the first height H1 and the third height H3 may be equal to each other and may be less than the second height H2 (H1=H3<H2).

The under bump UB may have a third thickness T3. The first dummy pattern DU1 and the second dummy pattern DU2 may each have a fourth thickness T4. The third thickness T3 may be greater than the fourth thickness T4. The second thickness T2 may be greater than the first height H1. For example, the fourth thickness T4 may be about 1.5 times to about 2.5 times the first height H1. The fourth thickness T4 may range, for example, from about 5 μm to about 20 μm.

Referring to FIG. 3C, a first angle θ1 may be made between the sidewall SW of the under bump UB and the bottom surface IL2_B of the second dielectric layer IL2. A second angle θ2 may be made between a sidewall DSW1 of the first dummy pattern DU1 and the bottom surface IL2_B of the second dielectric layer IL2. The first angle θ1 may be equal to the second angle θ2. The sidewall SW of the under bump UB may have a length greater than that of the sidewall DSW1 of the first dummy pattern DU1.

The dummy patterns DU1 and DU2 may be supplied with no voltage and may be electrically floated. Alternatively, at least one selected from the dummy patterns DU1 and DU2 may be provided with a ground voltage. In this case, at least one selected from the dummy patterns DU1 and DU2 may be electrically connected to at least one selected from the first to fourth redistribution patterns RP1 to RP4.

The first, second, and third barrier/seed patterns SP1, SP2, and SP3 may each include, for example, a double structure of a seed layer including copper and a barrier layer including one selected from titanium, tantalum, titanium nitride, tantalum nitride, and tungsten nitride. The bump metal pattern 50, the first dummy metal pattern 60, and the second dummy metal pattern 70 may include the same first metal, for example, copper. The external connection members OSB may include, for example, a second metal. The second metal may be, for example, at least one selected from tin, silver, and nickel. The second metal may diffuse into the bump metal pattern 50. For example, the second metal may be present in the first bump part 50a and the second bump part 50b, but may be absent in the third bump part 50c.

The third dielectric layer IL3 may be disposed on the second dielectric layer IL2. The third dielectric layer IL3 may cover the under bumps UB and the dummy patterns DU1 and DU2. In some example embodiments of the present inventive concept, since the under bumps UB and the dummy patterns DU1 and DU2 have T shapes, portions of the under bumps UB and the dummy patterns DU1 and DU2 that protrude onto the second dielectric layer IL2 may have a relatively small thickness. Therefore, there may be a reduction in step difference between the top surface IL2_U of the second dielectric layer IL2 and each of the top surfaces UB_U, DU1_U, and DU2_U of the under bumps UB and the dummy patterns DU1 and DU2, and thus, when the third dielectric layer IL3 is formed, it may be possible to prevent an undulation of the third dielectric layer IL3 and to cause the third dielectric layer IL3 to have a flat top surface. Accordingly, process defects may be prevented to increase the reliability of semiconductor packages.

Moreover, in some example embodiments of the present inventive concept, because the dummy patterns DU1 and DU2 are disposed between the under bumps UB, when the third dielectric layer IL3 is formed, dishing or undulation issues may be reduced such that the third dielectric layer IL3 may have a flat top surface. Accordingly, process defects may be prevented to increase the reliability of semiconductor packages.

Furthermore, according to some example embodiments of the present inventive concept, since the under bump UB has the inflection point IFP on the sidewall SW, the sidewall SW may become crooked and thus the under bump UB may have a relatively large length on the sidewall SW. Therefore, the under bump UB and each of the first and second dielectric layers IL1 and IL2 may have an increased contact area and thus have an increased adhesive force. In addition, when the first barrier/seed pattern SP1 is etched to expose a bottom surface of the bump metal pattern 50 included in the under bump UB in fabrication process, which will be discussed with reference to FIGS. 5H and 5I, the first barrier/seed pattern SP1 may be prevented from being excessively etched. Accordingly, the occurrence of a crack or delamination may be prevented on a lateral surface of the under bump UB.

Referring to FIGS. 2A and 3C, the first redistribution patterns RP1 and the first inner ground patterns IGP1 may be disposed on the third dielectric layer IL3. The first inner ground patterns IGP1 may be connected to each other to form a mesh shape when viewed in plan. The first inner ground patterns IGP1 may be provided with a ground voltage. Portions of the first redistribution patterns RP1 may penetrate the third dielectric layer IL3 and contact the under bumps UB. The first inner ground patterns IGP1 may correspond to portions of the first redistribution patterns RP1.

The fourth dielectric layer IL4 may cover the third dielectric layer IL3, the first redistribution patterns RP1, and the first inner ground patterns IGP1. The second redistribution patterns RP2 may be disposed on the fourth dielectric layer IL4. Portions of the second redistribution patterns RP2 may penetrate the fourth dielectric layer IL4 and contact the first redistribution patterns RP1. The fifth dielectric layer IL5 may cover the fourth dielectric layer IL4 and the second redistribution patterns RP2.

The third redistribution patterns RP3 and the second inner ground patterns IGP2 may be disposed on the fifth dielectric layer IL5. Portions of the third redistribution patterns RP3 may penetrate the fifth dielectric layer IL5 and electrically connect with the second redistribution patterns RP2. The second inner ground patterns IGP2 may be connected to each other to form a mesh shape when viewed in plan. The second inner ground patterns IGP2 may be provided with a ground voltage. The second inner ground patterns IGP2 may correspond to portions of the third redistribution patterns RP3.

The sixth dielectric layer IL6 may cover the fifth dielectric layer IL5, the third redistribution patterns RP3, and the second inner ground patterns IGP2. The fourth redistribution patterns RP4 may be disposed on the sixth dielectric layer IL6. Portions of the fourth redistribution patterns RP4 may penetrate the sixth dielectric layer IL6 and electrically connect with the third redistribution patterns RP3. The seventh dielectric layer IL7 may cover the sixth dielectric layer IL6 and the fourth redistribution patterns RP4. The redistribution conductive pads RPA may be disposed on the seventh dielectric layer IL7. The redistribution conductive pads RPA may penetrate the seventh dielectric layer IL7 and electrically connect with the fourth redistribution patterns RP4.

One or more of the first to fourth redistribution patterns RP1 to RP4 may be paths for electrical signals such as command/access signals. Another or more of the first to fourth redistribution patterns RP1 to RP4 may be paths for a ground voltage and/or a power voltage.

The first to fourth redistribution patterns RP1 to RP4, the first inner ground patterns IGP1, the second inner ground patterns IGP2, and the redistribution conductive pads RPA may each include a fourth barrier/seed pattern SP4 and a redistribution metal pattern IP, and at least one of the redistribution metal patterns IP may include a via part VP that penetrates a corresponding one of the third to sixth dielectric layers IL3 to IL6 and also include a line part LP disposed on the via part VP. The via part VP and the line part LP may be integrally formed into a single unitary piece. The fourth barrier/seed pattern SP4 may include, for example, a double structure of a seed layer including copper and a barrier layer including one selected from titanium, tantalum, titanium nitride, tantalum nitride, and tungsten nitride. The redistribution metal pattern IP may include, for example, copper.

The semiconductor device CH may be flip-chip mounted through inner connection members ISB on the first redistribution substrate RD1. The semiconductor device CH may be one selected from an image sensor chip such as a complementary metal-oxide-semiconductor (CMOS) image sensor (CIS), a microelectromechanical system (MEMS) device chip, an application specific integrated circuit (ASIC) chip, and a memory device chip such as a Flash memory chip, a dynamic random access memory (DRAM) chip, a static random access memory (SRAM) chip, an electrically erasable programmable read only memory (EEPROM) chip, a phase change random access memory (PRAM) chip, a magnetic random access memory (MRAM) chip, a resistive random access memory (ReRAM) chip, a high bandwidth memory (HBM) chip, and a hybrid memory cubic (HMC) chip. The inner connection members ISB may be, for example, at least one selected from solder balls, conductive bumps, and conductive pillars. The inner connection members ISB may include, for example, at least one selected from tin, nickel, silver, copper, gold, and aluminum. The inner connection members ISB may connect the redistribution conductive pads RPA to chip pads CPA of the semiconductor device CH.

An under fill layer UF may be interposed between the semiconductor device CH and the first redistribution substrate RD1. The mold layer MD may cover the semiconductor device CH and the first redistribution substrate RD1. The mold layer MD may include a dielectric resin, for example, an epoxy molding compound (EMC). The mold layer MD may further include fillers, and the fillers may be dispersed in the dielectric resin. The fillers may include, for example, silicon oxide ($SiO_2$). The under fill layer UF may include a thermo-curable resin or a photo-curable resin. In addition, the under fill layer UF may further include organic fillers or inorganic fillers.

FIGS. 5A to 5I illustrate enlarged cross-sectional views showing a method of fabricating a semiconductor package having the enlarged cross-section of FIG. 3C according to some example embodiments of the present inventive concept.

Referring to FIGS. 2A and 5A, a sacrificial substrate SSB may be prepared. The sacrificial substrate SSB may be, for example, a transparent glass substrate or a bare wafer. A sacrificial layer REL may be formed on the sacrificial substrate SSB. The sacrificial layer REL may include an epoxy resin. The sacrificial layer REL may have, for example, optical or thermal degradation properties. Alternatively, the sacrificial layer REL may include a conductive or dielectric material having an etch selectivity with respect to a first dielectric layer IL1 which will be discussed below. A first dielectric layer IL1 may be formed on the sacrificial layer REL. The first dielectric layer IL1 may be formed by a coating process. The first dielectric layer IL1 may be formed of a photo-imageable dielectric (PID) layer. The first dielectric layer IL1 may be formed to have the first thickness T1 of FIG. 3B.

Figure 5B:
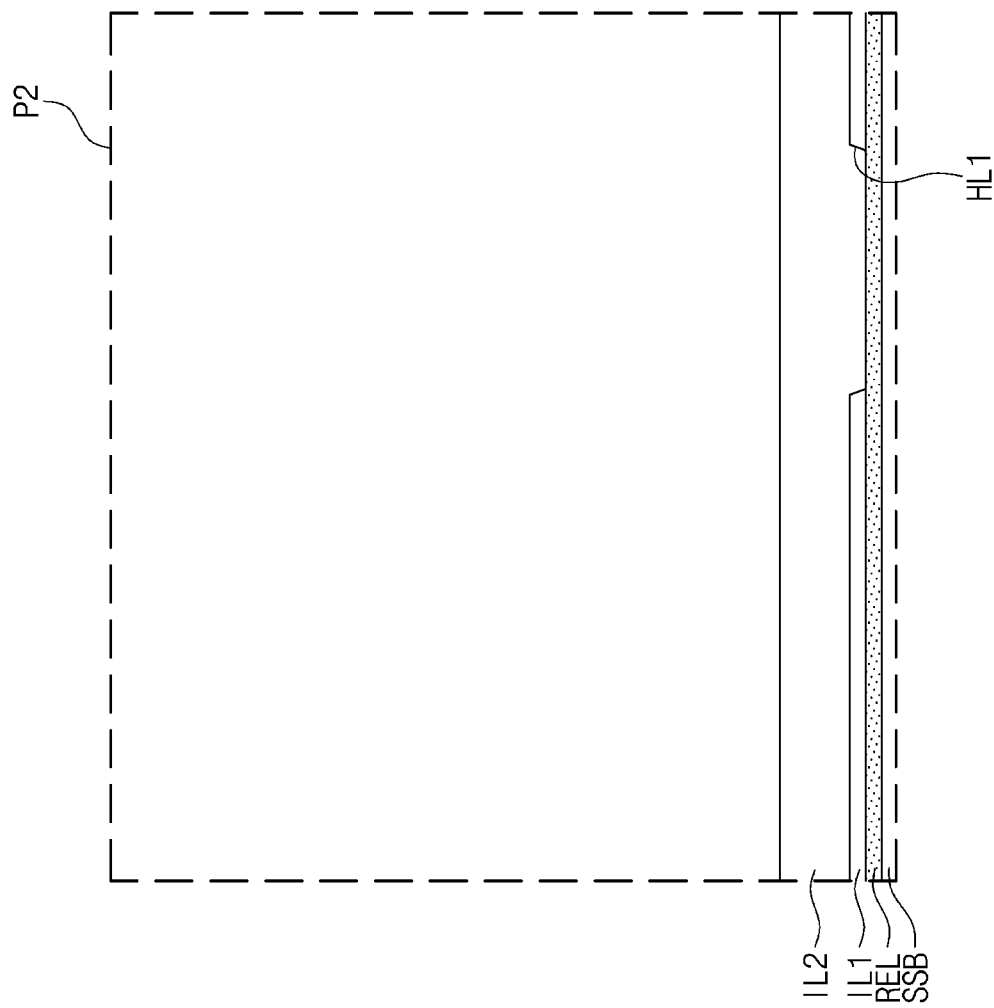

Referring to FIGS. 2A and 5B, the first dielectric layer IL1 may undergo exposure, development, and curing processes to form, in the first dielectric layer IL1, first holes HL1 that expose the sacrificial layer REL. A second dielectric layer IL2 may be coated on the first dielectric layer IL1 in which the first holes HL1 are formed. The second dielectric layer IL2 may be formed to have the second thickness T2 of FIG. 3B. A portion of the second dielectric layer IL2 may fill the first holes HL1.

Referring to FIGS. 2A, 3B, and 5C, the second dielectric layer IL2 may undergo exposure, development, and curing processes to form second holes HL2, first dummy holes DH1, and second dummy holes DH2. The second holes HL2 may be formed to overlap the first holes HL1. The first dummy holes DH1 and the second dummy holes DH2 may be formed to expose a top surface of the first dielectric layer IL1. The second holes HL2 may be formed to have their widths greater than those of the first holes HL1. Since the second dielectric layer IL2 is thicker than the first dielectric layer IL1, in the curing process, the second dielectric layer IL2 may experience shrinkage greater than that of the first dielectric layer IL1. Therefore, the second holes HL2 may partially expose a top surface of the first dielectric layer IL1. Since the second holes HL2, the first dummy holes DH1, and the second dummy holes DH2 are simultaneously formed in the same exposure process, as discussed with reference to FIG. 3C, the same angle (e.g., the first angle θ1 or the second angle θ2) may be formed between the bottom surface IL2_B of the second dielectric layer IL2 and the inner sidewalls of the second holes HL2, the first dummy holes DH1, and the second dummy holes DH2.

Figure 5D:
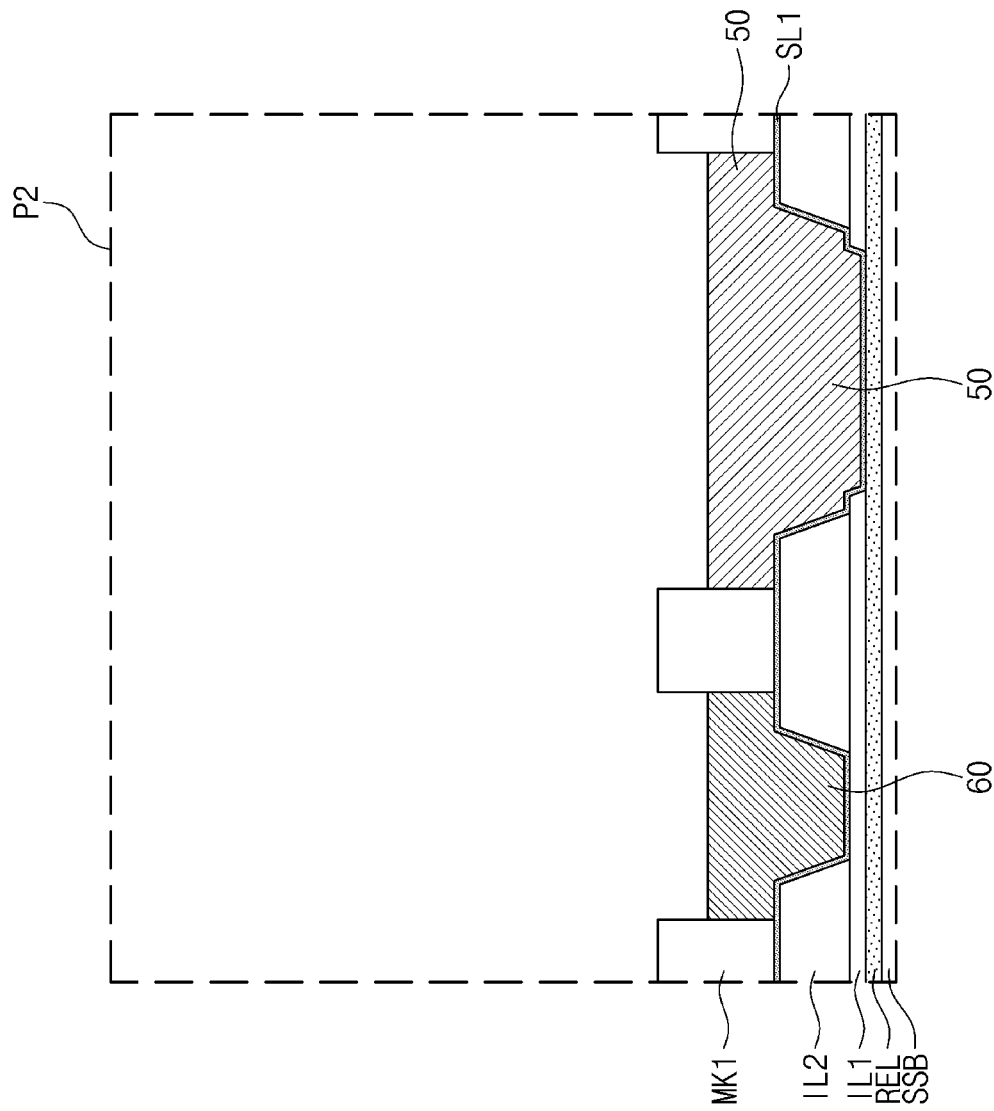

Referring to FIGS. 2A, 3B, and 5D, a first barrier/seed layer SL1 may be conformally formed on entire surfaces (e.g., entire exposed surfaces) of the sacrificial substrate SSB, the first dielectric layer IL1, in which the first holes HL1 are formed, and the second dielectric layer IL2, in which the second holes HL2, the first dummy holes DH1, and the second dummy holes DH2 are formed. First mask patterns MK1 may be formed on the first barrier/seed layer SL1. The first mask patterns MK1 may limit positions of under bumps UB and dummy patterns DU1 and DU2 which will be discussed below. The first mask patterns MK1 may be, for example, photoresist patterns. A plating process may be performed to form metal patterns 50, 60, and 70 on the first barrier/seed layer SL1 exposed by the first mask patterns MK1.

Referring to FIGS. 2A, 3B, and 5E, the first mask patterns MK1 may be removed to expose the first barrier/seed layer SL1 on sides of the metal patterns 50, 60, and 70. An etching process may be performed to remove the first barrier/seed layer SL1 on sides of the metal patterns 50, 60, and 70 and to form first, second, and third barrier/seed patterns SP1, SP2, and SP3. Therefore, there may be formed under bumps UB and dummy patterns DU1 and DU2. For example, the under bump UB may include the metal pattern 50 and the first barrier/seed pattern SP1, and the first dummy pattern DU1 may include the metal pattern 60 and the second barrier/seed pattern SP2. A third dielectric layer IL3 may be coated on the second dielectric layer IL2, the under bumps UB, and the dummy patterns DU1 and DU2. In this stage, the dummy patterns DU1 and DU2 between the under bumps UB may increase flatness of the third dielectric layer IL3. In addition, the under bumps UB and the dummy patterns DU1 and DU2 may each have a T-shaped cross-section, and accordingly the flatness of the third dielectric layer IL3 may further increase.

Figure 5F:
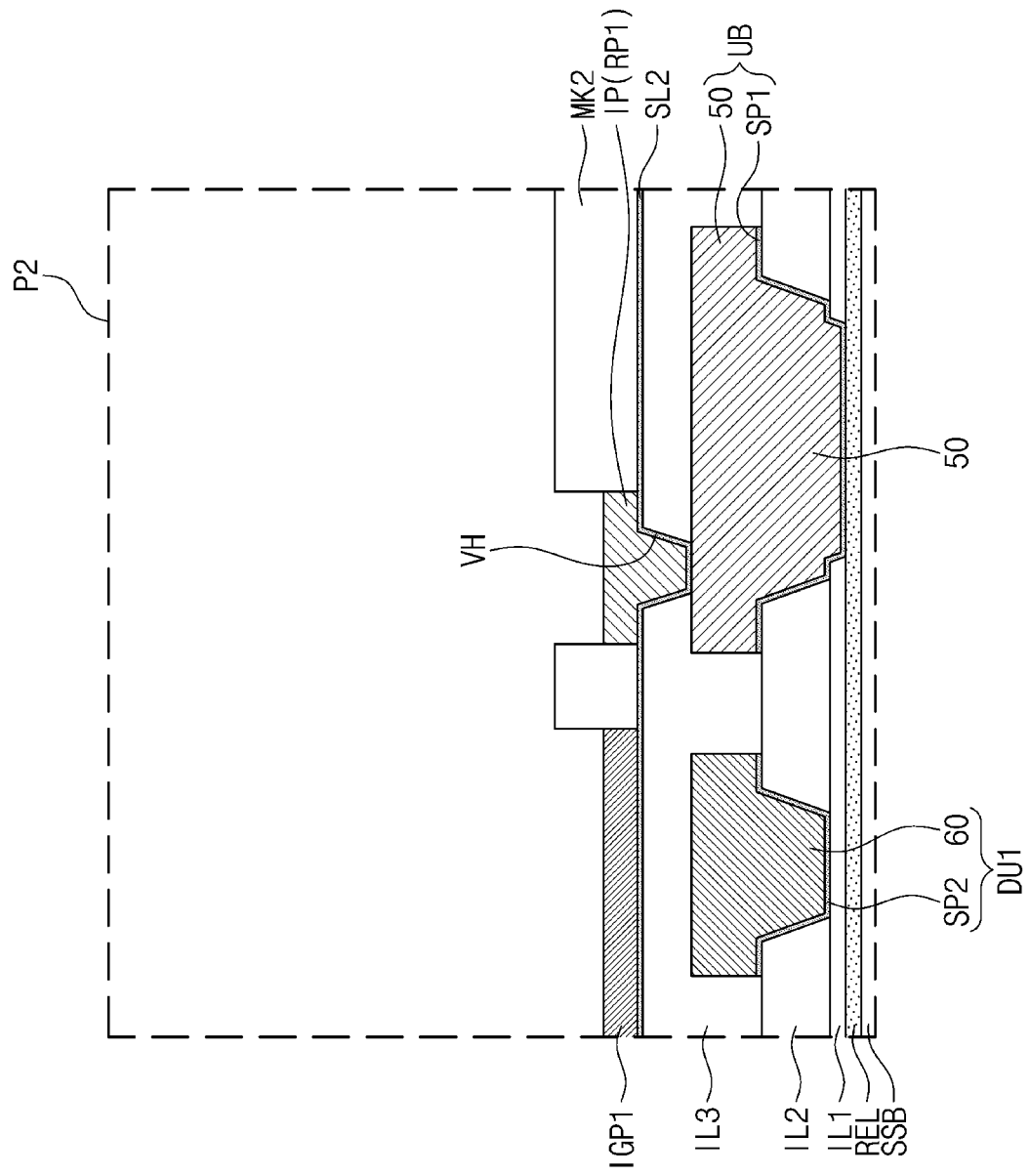

Referring to FIGS. 2A, 5E, and 5F, the third dielectric layer IL3 may undergo exposure, development, and curing processes to form, in the third dielectric layer IL3, via holes VH that expose the under bumps UB. In this stage, since the flatness of the third dielectric layer IL3 increases as described above, no failure may occur in the exposure process. Hence, the via hole VH may be precisely formed.

A second barrier/seed layer SL2 may be conformally formed on the third dielectric layer IL3. Second mask patterns MK2 may be formed on the second barrier/seed layer SL2. The second mask patterns MK2 may limit positions of first inner ground patterns IGP1 and first redistribution patterns RP1 which will be discussed below. The second mask patterns MK2 may include, for example, photoresist patterns. The second mask patterns MK2 may be formed by coating a photoresist layer and then exposing and developing the photoresist layer. In this stage, since the flatness of the third dielectric layer IL3 increases as described above, no failure may occur in the exposure process. Hence, the second mask patterns MK2 may be precisely formed A plating process may be performed to form a plating layer from a top surface of the second barrier/seed layer SL2 that is exposed without being covered with the second mask patterns MK2, which may result in the formation of first inner ground patterns IGP1 and a redistribution metal pattern IP of first redistribution patterns RP1.

Figure 5G:
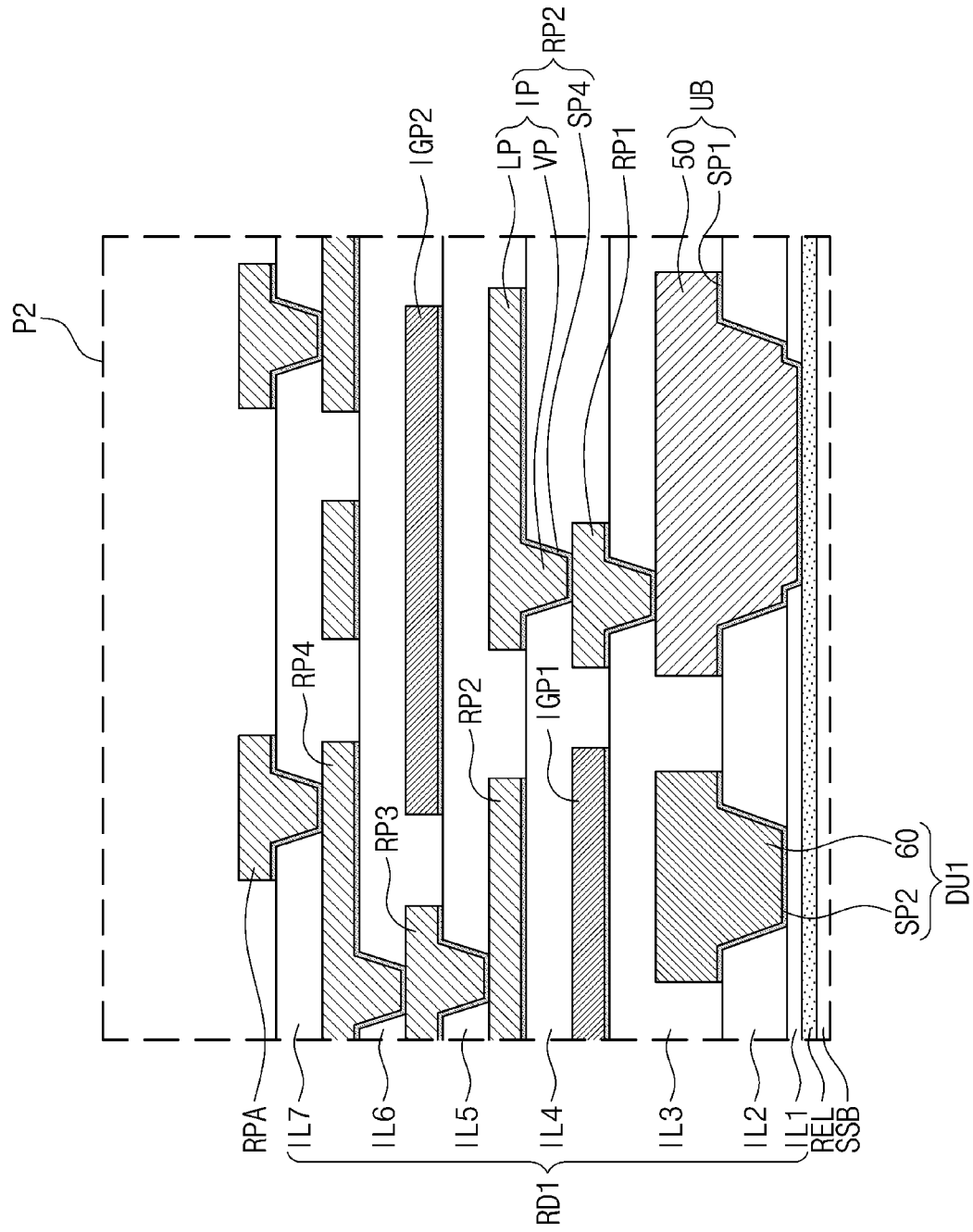

Referring to FIGS. 2A, 5F, and 5G, the second mask patterns MK2 may be removed to expose the second barrier/seed layer SL2. The second barrier/seed layer SL2 may be removed which is exposed on sides of the first inner ground patterns IGP1 and the redistribution metal pattern IP, and the fourth barrier/seed patterns SP4 may be formed below the first inner ground patterns IGP1 and the redistribution metal pattern IP. The formation of the first inner ground patterns IGP1 and the first redistribution patterns RP1 may be identically or similarly repeated to form fourth to seventh dielectric layers IL4 to IL7, second to fourth redistribution patterns RP2 to RP4, second inner ground patterns IGP2, and redistribution conductive pads RPA. Accordingly, a first redistribution substrate RD1 may be manufactured.

Figure 5H:
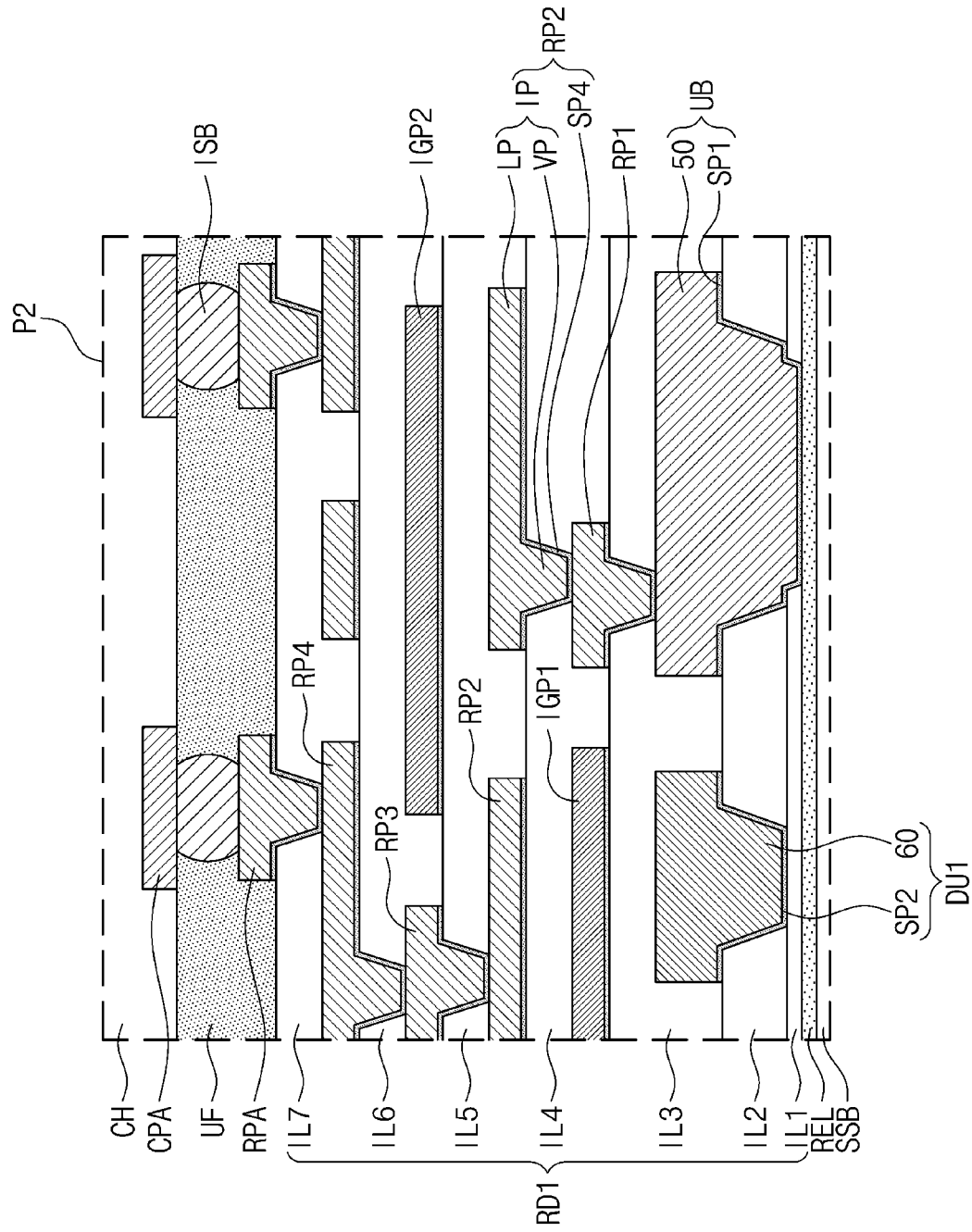

Referring to FIGS. 2A and 5H, inner connection members ISB may be used to bond a semiconductor device CH to the redistribution conductive pads RPA. An under fill layer UF may be formed between the semiconductor device CH and the first redistribution substrate RD1.

Figure 5I:
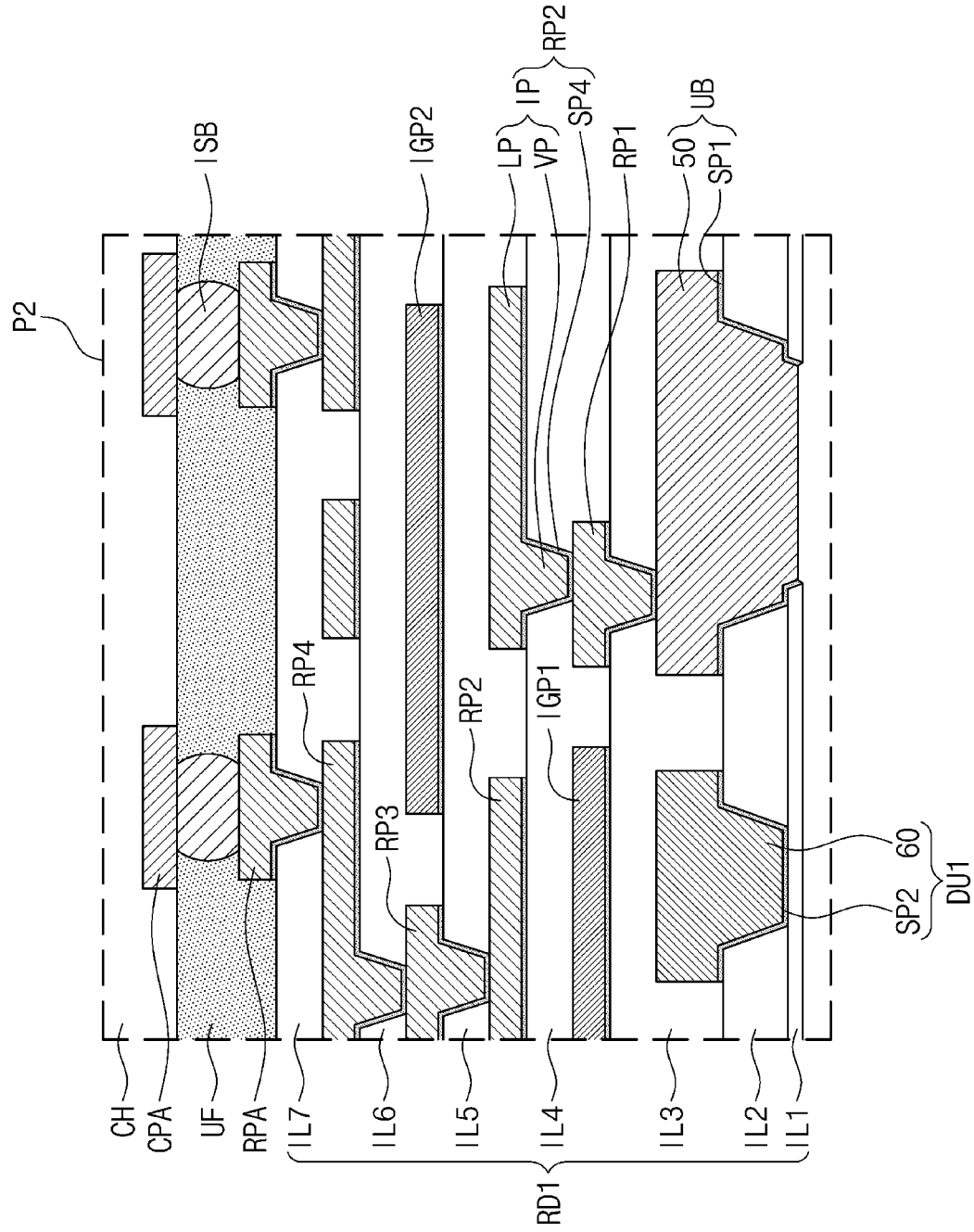

Referring to FIGS. 2A, 5H, and 5I, the sacrificial layer REL and the sacrificial substrate SSB may be removed. In this case, when the sacrificial layer REL has optical degradation properties, light may be irradiated through the sacrificial substrate SSB. When the sacrificial layer REL has thermal degradation properties, heat may be applied adjacent to the sacrificial substrate SSB. Alternatively, the sacrificial substrate SSB may be physically separated from the sacrificial layer REL, and a remaining sacrificial layer REL may be removed by an etching process or a chemical mechanical polishing (CMP) process. Therefore, there may be exposed a bottom surface of the first dielectric layer IL1. In this stage, there may also be exposed a bottom surface of the first barrier/seed pattern SP1 included in the under bump UB. The exposed first barrier/seed pattern SP1 may undergo an etching process to remove a portion of the first barrier/seed pattern SP1 and to expose a bottom surface of a bump metal pattern 50 included in the under bump UB. A structure of FIG. 4A or 4B may be formed based on the degree of etching of the first barrier/seed pattern SP1. In the present embodiment, the first and second holes HL1 and HL2 may cause the first barrier/seed pattern SP1 to have an increased length. Thus, even if the first barrier/seed pattern SP1 is partially removed, a remaining first barrier/seed pattern SP1 may have a length sufficient enough to prevent a crack or delamination on a sidewall of the under bump UB. Since the dummy patterns DU1 and DU2 are covered with the first dielectric layer IL1, the dummy patterns DU1 and DU2 may not be damaged in the etching process.

Subsequently, referring to FIG. 3C, an external connection member OSB may be bonded to the bottom surface of the bump metal pattern 50 included in the under bump UB. In this stage, since the dummy patterns DU1 and DU2 are covered with the first dielectric layer IL1, electrical shorts may be prevented between the external connection member OSB and the dummy patterns DU1 and DU2.

Figure 6:
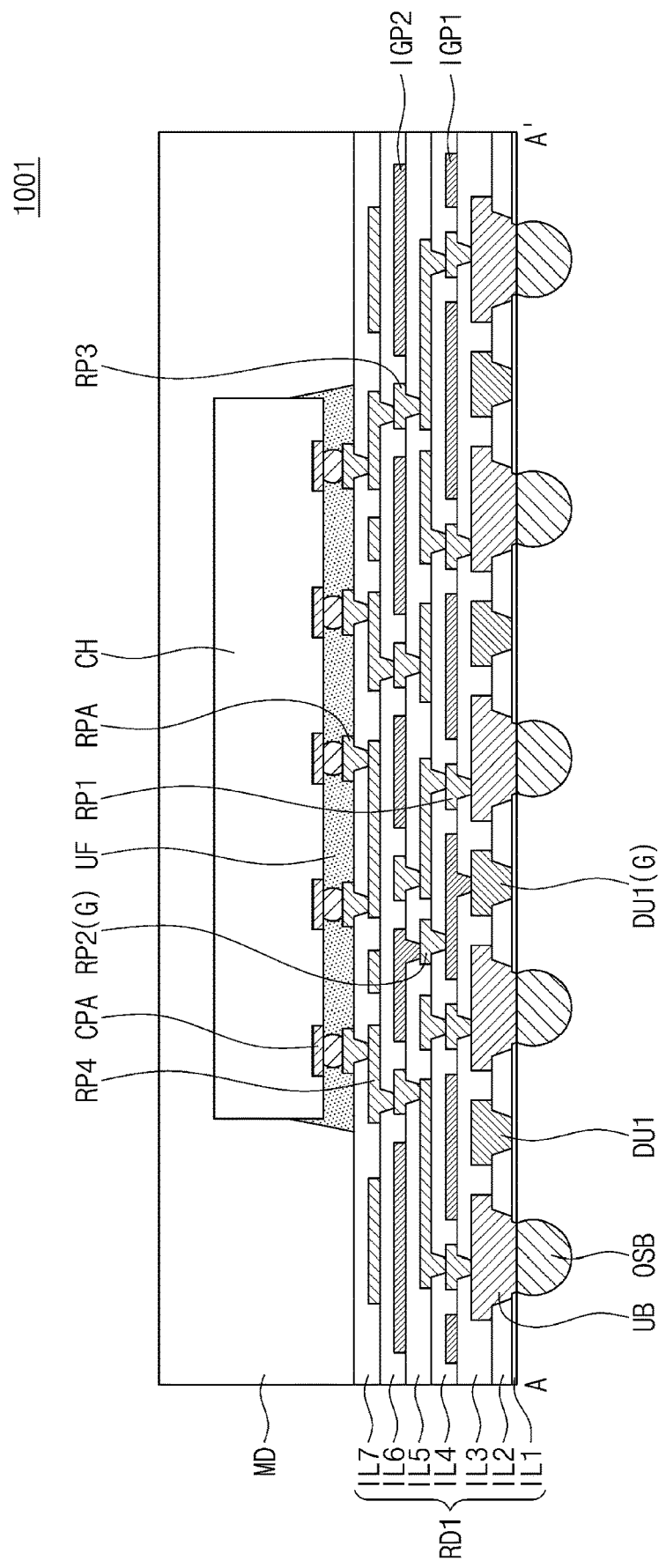
FIG. 6 illustrates a cross-sectional view taken along line A-A' of FIG. 1.

FIG. 6 illustrates a cross-sectional view taken along line A-A' of FIG. 1.

Referring to FIG. 6, a semiconductor package 1001 according to the present embodiment may be configured such that the dummy patterns DU1 and DU2 may be provided with ground voltage. For example, one DUL1(G) of the first dummy patterns DU1 may be in contact with a via part of the first inner ground pattern IGP1. In addition, the first inner ground pattern IGP1 may be connected to the second inner ground pattern IGP2 through one RP2(G) of the second redistribution patterns RP2. When the dummy patterns DU1 and DU2 are provided with a ground voltage as mentioned above, the dummy patterns DU1 and DU2 may serve as an electromagnetic shield to reduce signal noise and to suppress interference between electrical signals applied to adjacent under bumps UB. Other configurations may be identical or similar to those discussed with reference to FIGS. 1 to 4B.

Figure 7:
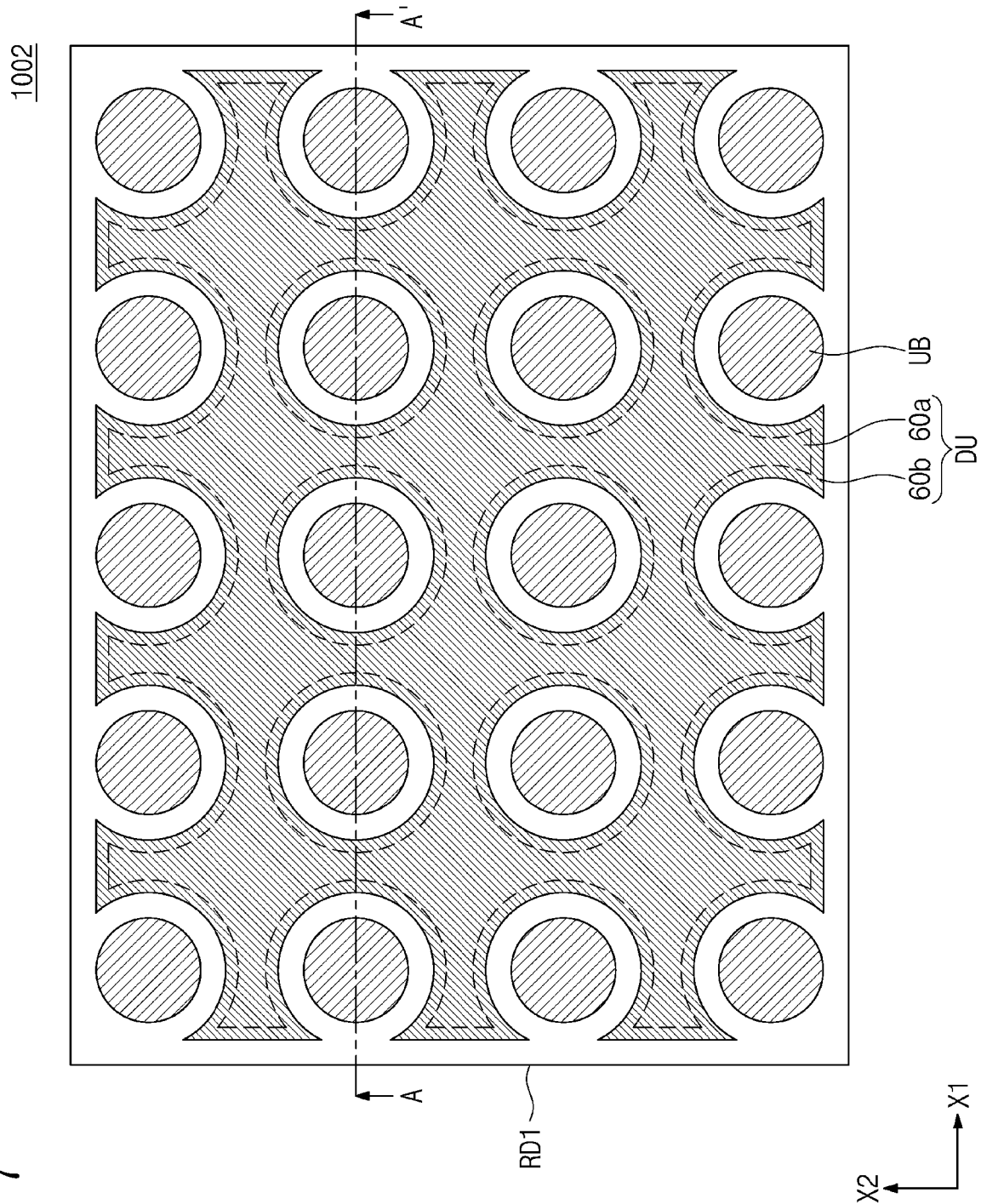
FIG. 7 illustrates a plan view showing a semiconductor package according to some example embodiments of the present inventive concept.

FIG. 7 illustrates a plan view showing a semiconductor package according to some example embodiments of the present inventive concept. A cross-section taken along line A-A' of FIG. 7 may be identical or similar to that of FIG. 6.

Referring to FIG. 7, a semiconductor package 1002 according to the present embodiment may be configured such that when viewed in plan a dummy pattern DU may have a mesh shape, in which the dummy patterns DU1 and DU2 of FIG. 1 are connected to each other, and may surround the under bumps UB. The dummy pattern DU may include a first dummy part 60*a* and a second dummy part 60*b* each of which constitutes a mesh shape. The dummy pattern DU may be electrically floated or may be provided with a ground voltage. When the dummy pattern DU is provided with a ground voltage, the mesh shape of the dummy pattern DU may facilitate connection of the first redistribution pattern RP1 or the first inner ground pattern IGP1. Other configurations may be identical or similar to those discussed with reference to FIGS. 1 to 4B.

Figure 8:
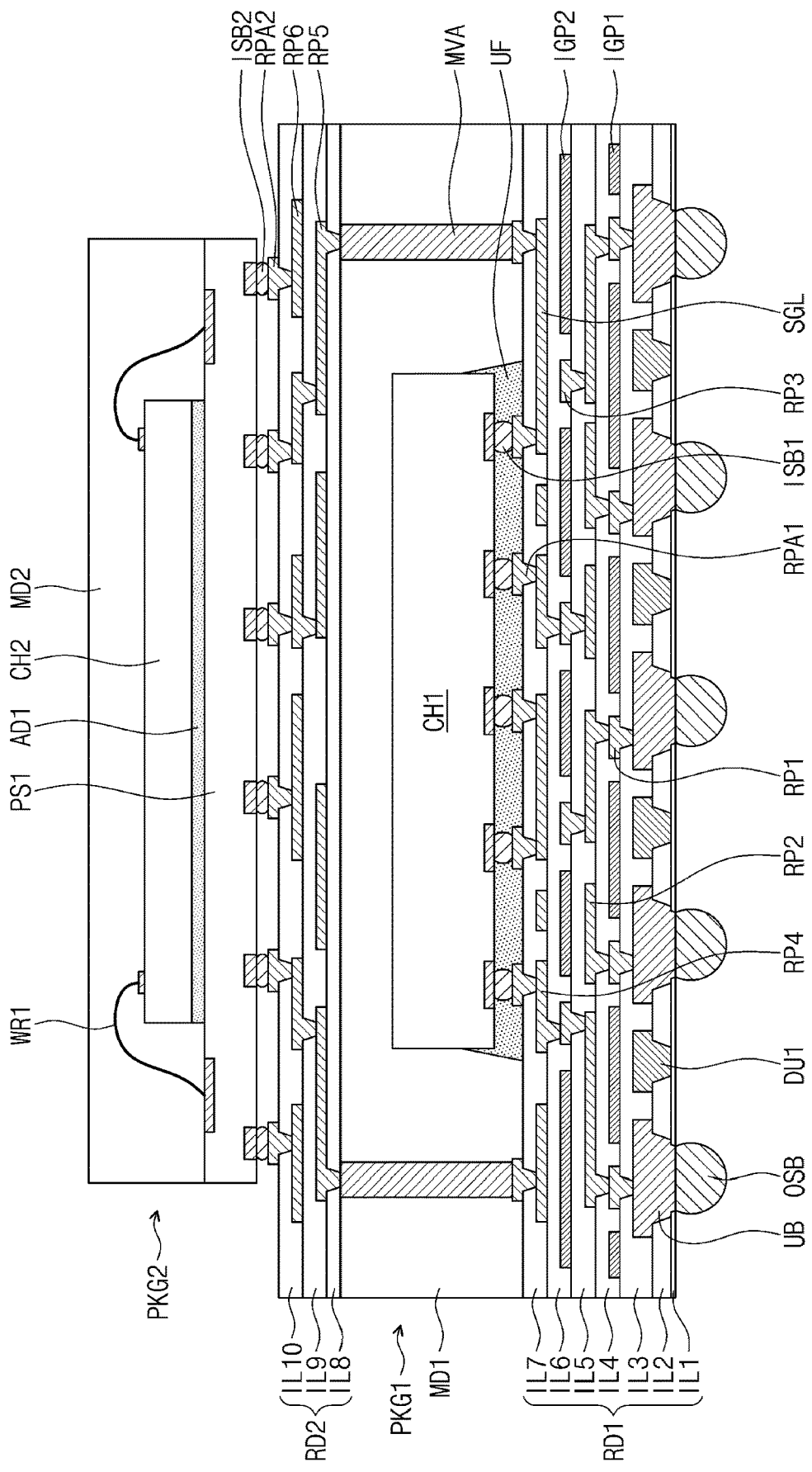
FIG. 8 illustrates a cross-sectional view showing a semiconductor package according to some example embodiments of the present inventive concept.

FIG. 8 illustrates a cross-sectional view showing a semiconductor package according to some example embodiments of the present inventive concept.

Referring to FIG. 8, a semiconductor package 1003 according to the present embodiment may have a package-on-package structure in which a second sub-semiconductor package PKG2 is mounted on the first sub-semiconductor package PKG1. The first sub-semiconductor package PKG1 may include a first redistribution substrate RD1 and a first semiconductor device CH1 mounted on the first redistribution substrate RD1.

The first redistribution substrate RD1 may further include a signal pattern SGL for connection between the second sub-semiconductor package PKG2 and the first semiconductor device CH1. The signal pattern SGL may be a portion of the fourth redistribution patterns RP4. Other configurations of the first redistribution substrate RD1 may be identical or similar to those discussed with reference to FIGS. 1 to 4B. The first semiconductor device CH1 may be connected through a first inner connection member ISB1 to a first redistribution conductive pad RPA1 of the first redistribution substrate RD1. The first semiconductor device CH1 and the first redistribution substrate RD1 may be covered with a first mold layer MD1 The first mold layer MD1 may have therein a mold via MVA that penetrates therethrough. The mold via MVA may include at least one metal selected from copper, aluminum, tungsten, nickel, gold, and tin.

A second redistribution substrate RD2 may be disposed on the first mold layer MD1. The second redistribution substrate RD2 may include eighth, ninth and tenth dielectric layers IL8, IL9 and IL10 that are sequentially stacked, fifth and sixth redistribution patterns RP5 and RP6, and second redistribution conductive pads RPA2. The eighth to tenth dielectric layers IL8 to IL10 may each include a photo-imageable dielectric (PID). The fifth and sixth redistribution patterns RP5 and RP6 and the second redistribution conductive pads RPA2 may each include a conductive material.

The fifth redistribution pattern RP5 may be interposed between the eighth dielectric layer IL5 and the ninth dielectric layer IL9. The fifth redistribution pattern RP5 may penetrate the eighth dielectric layer IL8 and contact the mold via MVA. The sixth redistribution pattern RP6 may be interposed between the ninth dielectric layer IL9 and the tenth dielectric layer IL10. The sixth redistribution pattern RP6 may penetrate the ninth dielectric layer IL9 and contact the fifth redistribution pattern RP5. The second redistribution conductive pads RPA2 may be disposed on the tenth dielectric layer IL10, and may penetrate the tenth dielectric layer IL10 and connect with the sixth redistribution pattern RP6.

Like the first to fourth redistribution patterns RP1 to RP4 discussed with reference to FIGS. 1 to 4B, the fifth and sixth redistribution patterns RP5 and RP6 may each include a fourth barrier/seed pattern SP4 and a redistribution metal pattern IP. The first and second redistribution conductive pads RPA1 and RPA2 may each be identical or similar to the redistribution conductive pad RPA discussed with reference to FIGS. 1 to 4B.

The second sub-semiconductor package PKG2 may include a first sub-package substrate PS1, a second semiconductor device CH2 disposed on the first sub-package substrate PS1, a first adhesion layer AD1 interposed between the first sub-package substrate PS1 and the second semiconductor device CH2, a second mold layer MD2 that covers the first sub-package substrate PS1 and the second semiconductor device CH2, and first wires WR1 that connect the first sub-package substrate PS1 to the second semiconductor device CH2. The first sub-package substrate PS1 may be a double-sided or multi-layered printed circuit board. Alternatively, the first sub-package substrate PS1 may be another redistribution substrate.

The first and second semiconductor devices CH1 and CH2 may independently be one selected from an image sensor chip such as CMOS image sensor (CIS), a microelectromechanical system (MEMS) device chip, an application specific integrated circuit (ASIC) chip, and a memory device chip such as a Flash memory chip, a dynamic random access memory (DRAM) chip, a static random access memory (SRAM) chip, an electrically erasable programmable read only memory (EEPROM) chip, a phase change random access memory (PRAM) chip, a magnetic random access memory (MRAM) chip, a resistive random access memory (ReRAM) chip, a high bandwidth memory (HBM) chip, and a hybrid memory cubic (HMC) chip.

Other configurations may be identical or similar to those discussed with reference to FIGS. 1 to 4B.

Figure 9:
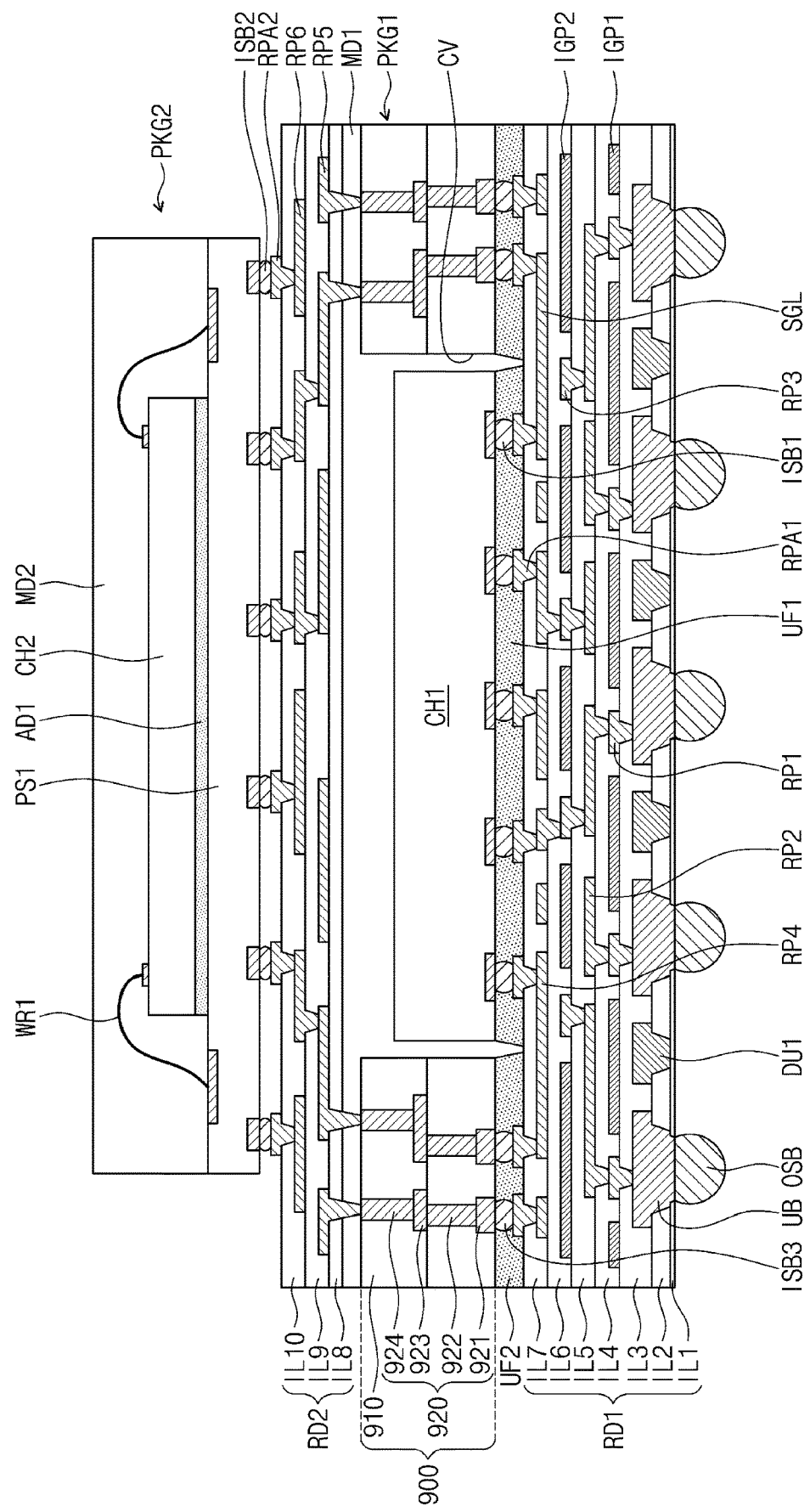
FIG. 9 illustrates a cross-sectional view showing a semiconductor package according to some example embodiments of the present inventive concept.

FIG. 9 illustrates a cross-sectional view showing a semiconductor package according to some example embodiments of the present inventive concept.

Referring to FIG. 9, a semiconductor package 1004 according to the present embodiment may be configured such that the first sub-semiconductor package PKG1 further may include a connection substrate 900. The connection substrate 900 may be disposed on the first redistribution substrate RD1. The connection substrate 900 may include a cavity region CV into which the first semiconductor device CH1 is inserted. The connection substrate 900 may be connected through third inner connection members ISB3 to the first redistribution conductive pads RPA t of the first redistribution substrate RD1. A first under fill layer UF1 may be interposed between the first semiconductor device CH1 and the first redistribution substrate RD1. A second under fill layer UF2 may be interposed between the connection substrate 900 and the first redistribution substrate RD1.

The connection substrate 900 may include a plurality of base layers 910 and a plurality of conductive structures 920. The base layers 910 are illustrated formed of two layers in the present embodiment, but the present inventive concept is not limited thereto, and the base layers 910 may be formed of three or more layers. The base layers 910 may include a dielectric material. For example, the base layers 910 may include a carbon-based material, a ceramic, or a polymer.

The conductive structure 920 may include a connection pad 921, a first connection via 922, a first connection line 923, and a second connection via 924. In the present embodiment, the first connection via 922 and the first connection line 923 may be integrally formed into a single unitary piece. The conductive structure 920 may include metal, such as copper, aluminum, gold, nickel, or titanium. The first mold layer MD1 may cover the connection substrate 900.

The fifth redistribution pattern RP5 of the second redistribution substrate RD2 may penetrate the eighth dielectric layer IL8 and the first mold layer MD1, thereby being in contact with the second connection via 924. Other configurations may be identical or similar to those discussed above with reference to FIG. 8.

Figure 10:
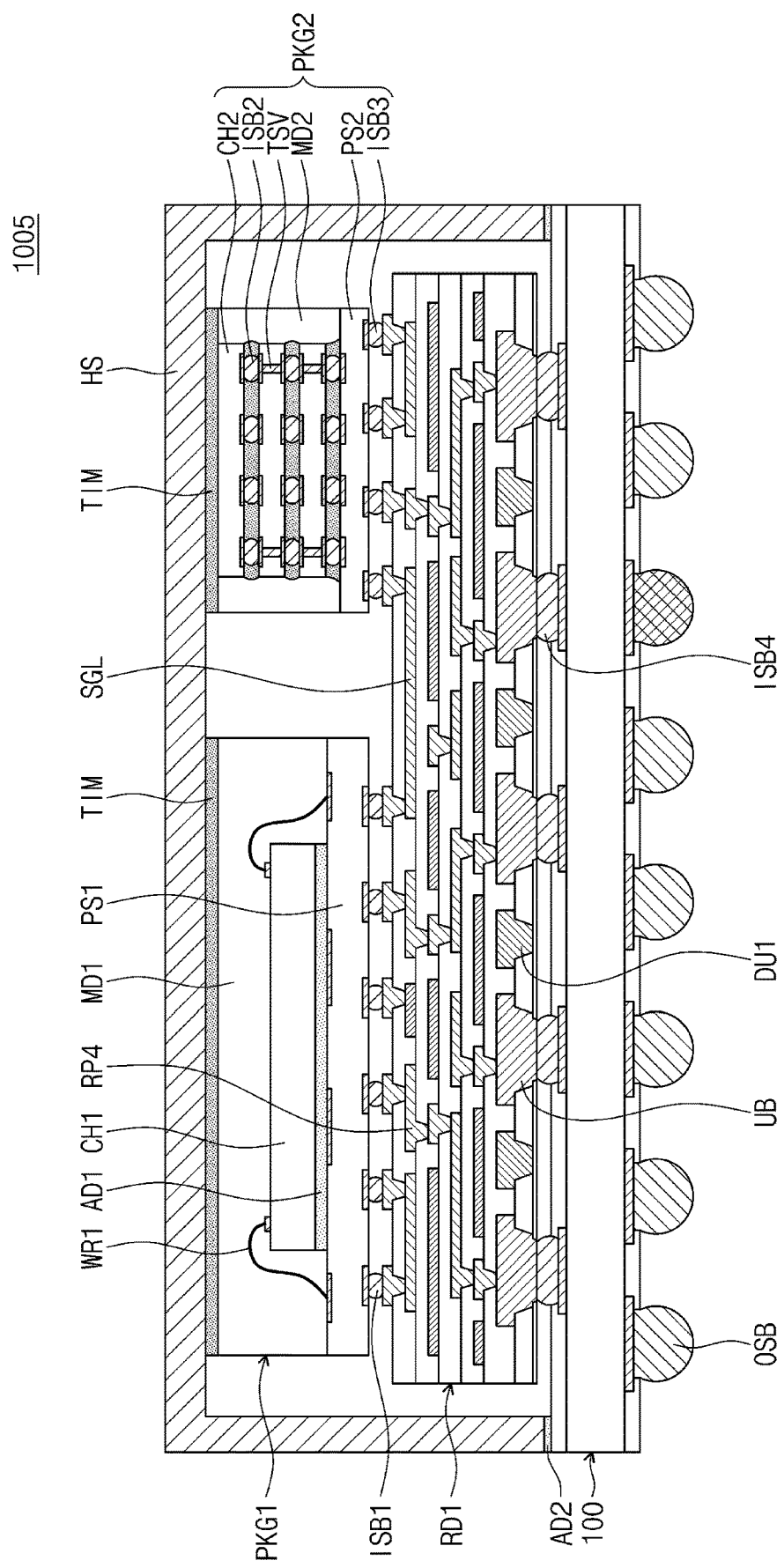
FIG. 10 illustrates a cross-sectional view showing a semiconductor package according to some example embodiments of the present inventive concept.

FIG. 10 illustrates a cross-sectional view showing a semiconductor package according to some example embodiments of the present inventive concept.

Referring to FIG. 10, a semiconductor package 1005 according to the present embodiment may be configured such that the first redistribution substrate RD1 may be flip-chip mounted through fourth inner connection members ISB4 on a first package substrate 100. The first package substrate 100 may be, for example, a double-sided or multi-layered printed circuit board. Alternatively, the first package substrate 100 may be another redistribution substrate. In the present embodiment, the first redistribution substrate RD1 may be called an interposer substrate.

A plurality of external connection members OSB may be bonded to the first package substrate 100. The first sub-semiconductor package PKG1 and the second sub-semiconductor package PKG2 may be mounted side by side on the first redistribution substrate RD1.

The first sub-semiconductor package PKG1 may include a first sub-package substrate PS1, a first semiconductor device CH1 disposed on the first sub-package substrate PS1, a first adhesion layer AD1 interposed between the first sub-package substrate PS1 and the first semiconductor device CH1, a first mold layer MD1 that covers the first sub-package substrate PS1 and the first semiconductor device CH1, and first wires WR1 that connect the first sub-package substrate PS1 to the first semiconductor device CH1.

The second sub-semiconductor package PKG2 may include a second sub-package substrate PS2, second semiconductor devices CH2 stacked on the second sub-package substrate PS2, and a second mold layer MD2 that covers the second sub-package substrate PS2 and the second semiconductor devices CH2. At least one of the second semiconductor devices CH2 may include one or more through vias TSV. The through via TSV may include metal, such as copper or tungsten. The second semiconductor devices CH2 may be electrically connected through second inner connection members ISB2 to the second sub-package substrate PS2. The second semiconductor devices CH2 may be, for example, memory chips. The second sub-package substrate PS2 may be a logic chip that drives the memory chips.

The first sub-semiconductor package PKG1 may be connected through first inner connection members ISB1 to the first redistribution substrate RD1. The second sub-semiconductor package PKG2 may be connected through third inner connection members ISB3 to the first redistribution substrate RD1. The first redistribution substrate RD1 may further include a signal pattern SGL that connects the first sub-semiconductor package PKG1 to the second sub-semiconductor package PKG2. The signal pattern SGL may be a portion of the fourth redistribution patterns RP4. A thermal radiation member HS may cover the first redistribution substrate RD1, the first and second sub-semiconductor packages PKG1 and PKG2, and the first package substrate 100.

A thermal interface material layer TIM may be interposed between the thermal radiation member HS and the first and second sub-semiconductor packages PKG1 and PKG2. The thermal interface material layer TIM may include a grease or thermosetting resin layer. The thermal interface material layer TIM may further include filler particles dispersed in the thermosetting resin layer. The filler particles may include a graphene powder or a metal powder whose thermal conductivity is high. Alternatively, the filler particles may include at least one selected from silica, alumina, zinc oxide, and boron nitride.

A second adhesion layer AD2 may be interposed between the first package substrate 100 and a bottom end of the thermal radiation member HS. The first and second sub-semiconductor packages PKG1 and PKG2 may have therebetween an empty space with no mold layer.

The thermal radiation member HS may include a material whose thermal conductivity is high, for example, graphene or metal such as tungsten, titanium, copper, or aluminum. The thermal radiation member HS may include a conductive material. The thermal radiation member HS may also serve as an electromagnetic shield. Other configurations may be identical or similar to those discussed with reference to FIGS. 1 to 4B.

A semiconductor package according to some example embodiments of the present inventive concept may be configured such that dummy patterns disposed between under bumps may increase flatness of a dielectric layer located on the dummy patterns. In addition, the under bumps and the dummy patterns may each have T shapes to further increase the flatness of the dielectric layer. Accordingly, process defects may be prevented to increase the reliability of the semiconductor package.

Moreover, since the under bump has an undulation on a sidewall thereof, an adhesive force between the under bump and the dielectric layer may increase to prevent a crack or delamination between the under bump and the dielectric layer. As a result, the semiconductor package may increase in reliability.

Furthermore, the dummy pattern may be provided with a ground voltage and thus may serve as an electromagnetic shield.

Although the present inventive concept has been described in connection with some example embodiments thereof, it will be understood to those skilled in the art that various changes and modifications may be made thereto without departing from the technical spirit and scope of the present inventive concept. The embodiments of FIGS. 1 to 10 may be combined with each other.

What is claimed is:

1. A semiconductor package, comprising:
   a first substrate and a semiconductor device on the first substrate,
   wherein the first substrate includes:
   a first dielectric layer including a first hole;
   a second dielectric layer on the first dielectric layer and including a second hole that overlaps the first hole, the second hole being wider than the first hole;
   an under bump disposed in the first hole and the second hole, the under bump covering a portion of the second dielectric layer; and
   a connection member bonded to the under bump.

2. The semiconductor package of claim 1, wherein a sidewall of the under bump has an inflection point.

3. The semiconductor package of claim 1, wherein the first substrate further includes a dummy pattern spaced apart from the under bump, the dummy pattern penetrating the second dielectric layer and contacting the first dielectric layer,
   wherein a portion of the dummy pattern covers a top surface of the second dielectric layer, and
   wherein a bottom surface of the dummy pattern is coplanar with a bottom surface of the second dielectric layer.

4. The semiconductor package of claim 3, wherein the dummy pattern is electrically floated or is provided with a ground voltage.

5. The semiconductor package of claim 3, wherein the dummy pattern and the under bump include the same metal, and a top surface of the dummy pattern is at the same height as a top surface of the under bump.

6. The semiconductor package of claim 3, wherein, when viewed in plan, the dummy pattern has a circular shape, a tetragonal shape whose sidewalls are concave, or a mesh shape.

7. The semiconductor package of claim 3, wherein
   the under bump has a first thickness, and the dummy pattern has a second thickness less than the first thickness.

8. The semiconductor package of claim 3, wherein an interval between the under bump and the dummy pattern is about 5 μm to about 50 μm.

9. The semiconductor package of claim 3, wherein the second dielectric layer includes a dummy hole into which the dummy pattern is inserted, the dummy hole exposing a top surface of the first dielectric layer,
wherein the dummy pattern includes:
a seed layer that covers an inner sidewall and a bottom surface of the dummy hole; and
a dummy metal pattern that fills the dummy hole.

10. The semiconductor package of claim 9, wherein
an inner sidewall of the second hole makes a first angle with a bottom surface of the second dielectric layer,
the inner sidewall of the dummy hole makes a second angle with the bottom surface of the second dielectric layer, and
the first angle is substantially the same as the second angle.

11. The semiconductor package of claim 1, wherein the under bump includes:
a barrier/seed pattern that covers at least an inner sidewall of the second hole; and
a bump metal pattern disposed on the barrier/seed pattern and filling the second hole and the first hole, and
wherein an air gap is provided between the bump metal pattern and an inner sidewall of the first hole.

12. The semiconductor package of claim 11, wherein the connection member is in contact with the bump metal pattern.

13. A semiconductor package, comprising:
a package substrate;
an interposer substrate on the package substrate;
a first semiconductor device and a second semiconductor device mounted side by side on the interposer substrate; and
a thermal radiation member that covers the first semiconductor device, the second semiconductor device, the interposer substrate, and the package substrate,
wherein the interposer substrate includes:
a first dielectric layer including a first hole;
a second dielectric layer disposed on the first dielectric layer and including a second hole that overlaps the first hole, the second hole being wider than the first hole;
an under bump disposed in the first hole and the second hole, the under bump covering a portion of the second dielectric layer;
a connection member bonded to the under bump; and
a dummy pattern spaced apart from the under bump, the dummy pattern penetrating the second dielectric layer and contacting the first dielectric layer,
wherein a portion of the dummy pattern covers a top surface of the second dielectric layer,
wherein a bottom surface of the dummy pattern is coplanar with a bottom surface of the second dielectric layer, and
wherein an interval between the under bump and the dummy pattern is about 5 μm to about 50 μm.

14. The semiconductor package of claim 13, wherein the dummy pattern is electrically floated or is provided with a ground voltage.

15. The semiconductor package of claim 13, wherein the dummy pattern and the under bump include the same metal, and a top surface of the dummy pattern is at the same height as a top surface of the under bump.

16. The semiconductor package of claim 13, wherein, when viewed in plan, the dummy pattern has a circular shape, a tetragonal shape whose sidewalls are concave, or a mesh shape.

17. A semiconductor package, comprising:
a first substrate and a semiconductor device on the first substrate,
wherein the first substrate includes:
a first dielectric layer;
an under bump and a dummy pattern that are in the first dielectric layer and are spaced apart from each other; and
a connection member in contact with a bottom surface of the under bump,
wherein each of the under bump and the dummy pattern includes:
a first part inserted into the first dielectric layer; and
a second part that protrudes beyond the first dielectric layer and covers a top surface of the first dielectric layer,
wherein a sidewall of the first part of the under bump has an inflection point, and
wherein a bottom surface of the dummy pattern is covered with a portion of the first dielectric layer.

18. The semiconductor package of claim 17, wherein a length of a sidewall of the under bump is greater than a length of a sidewall of the dummy pattern.

19. The semiconductor package of claim 17, wherein the under bump includes:
a barrier/seed pattern in contact with the first dielectric layer; and
a bump metal pattern on the barrier/seed pattern and in contact with the connection member,
wherein an air gap is between the connection member and the barrier/seed pattern.

20. The semiconductor package of claim 17, wherein, when viewed in plan, the dummy pattern has a circular shape, a tetragonal shape whose sidewalls are concave, or a mesh shape.

* * * * *